United States Patent [19]
Eto

[11] Patent Number: 5,774,404
[45] Date of Patent: Jun. 30, 1998

[54] SEMICONDUCTOR MEMORY HAVING SELF-REFRESH FUNCTION

[75] Inventor: Satoshi Eto, Kawasaki, Japan

[73] Assignee: Fujitsu Limited, Kawasaki, Japan

[21] Appl. No.: 507,640

[22] Filed: Jul. 25, 1995

[30]  Foreign Application Priority Data

Oct. 21, 1994 [JP] Japan ..................................... 6-256952
Mar. 15, 1995 [JP] Japan ..................................... 7-055946

[51] Int. Cl.[6] ................................................. G11C 7/00
[52] U.S. Cl. .......................... 365/222; 365/148; 365/149; 365/189.07; 365/189.09; 365/203; 365/236
[58] Field of Search .................... 365/203, 222, 365/189.07, 189.09, 149, 148, 100, 102, 236

[56]  References Cited

U.S. PATENT DOCUMENTS 5,499,214   3/1996   Mori et al. ............................... 365/222

FOREIGN PATENT DOCUMENTS 59-56291   3/1984   Japan .
5-205465   8/1993   Japan .

*Primary Examiner*—Do Hyun Yoo
*Attorney, Agent, or Firm*—Armstrong, Westerman, Hattori, McLeland & Naughton

[57]  ABSTRACT

A semiconductor memory controls the timing of refreshing memory cells. The semiconductor memory has a capacitor for holding charges, a precharge circuit, and a current source. The precharge circuit has at least a transistor for precharging the capacitor. The current source has a positive temperature coefficient to increase a current as the temperature rises and discharges the capacitor. The timing of refreshing the memory cells is controlled according to a temporal change in the voltage of the capacitor. This arrangement is capable of refreshing the memory cells in a refresh period adjusted to the actual data hold time of the memory cells.

34 Claims, 30 Drawing Sheets

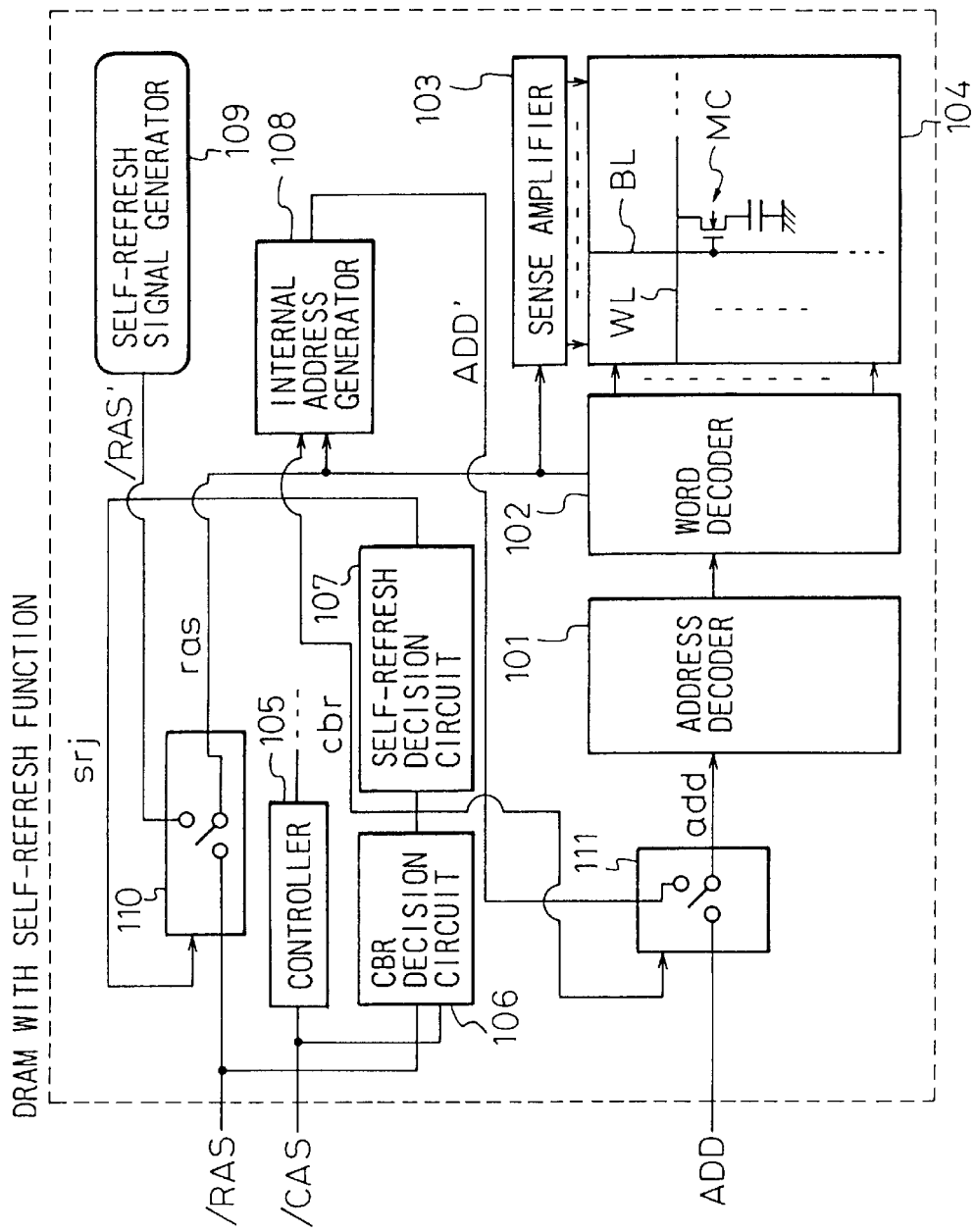

Fig.4A
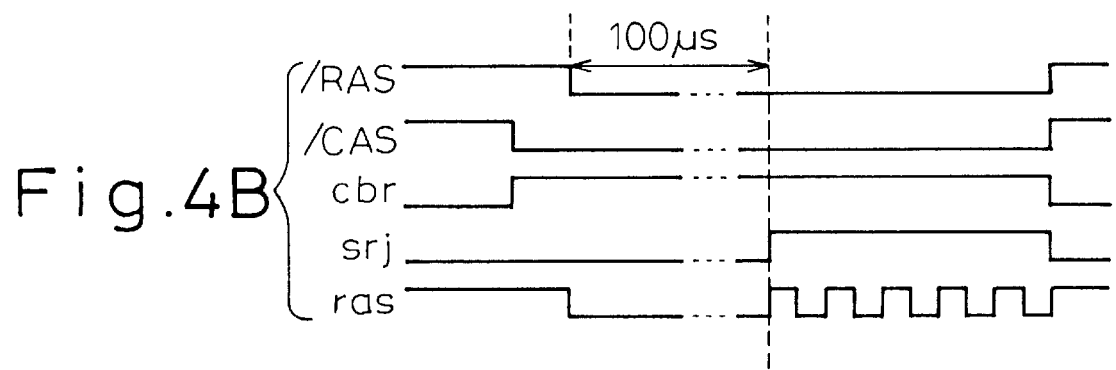
Fig.4B
Fig.5
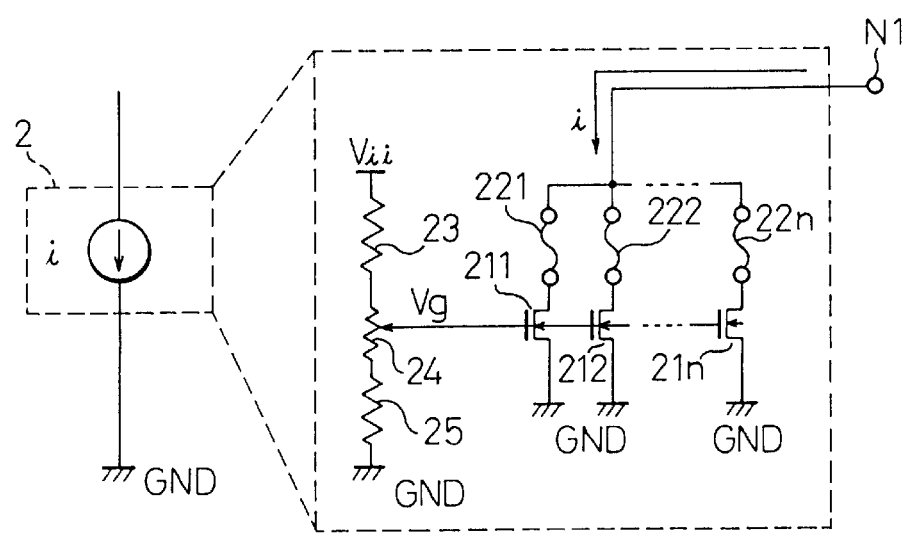

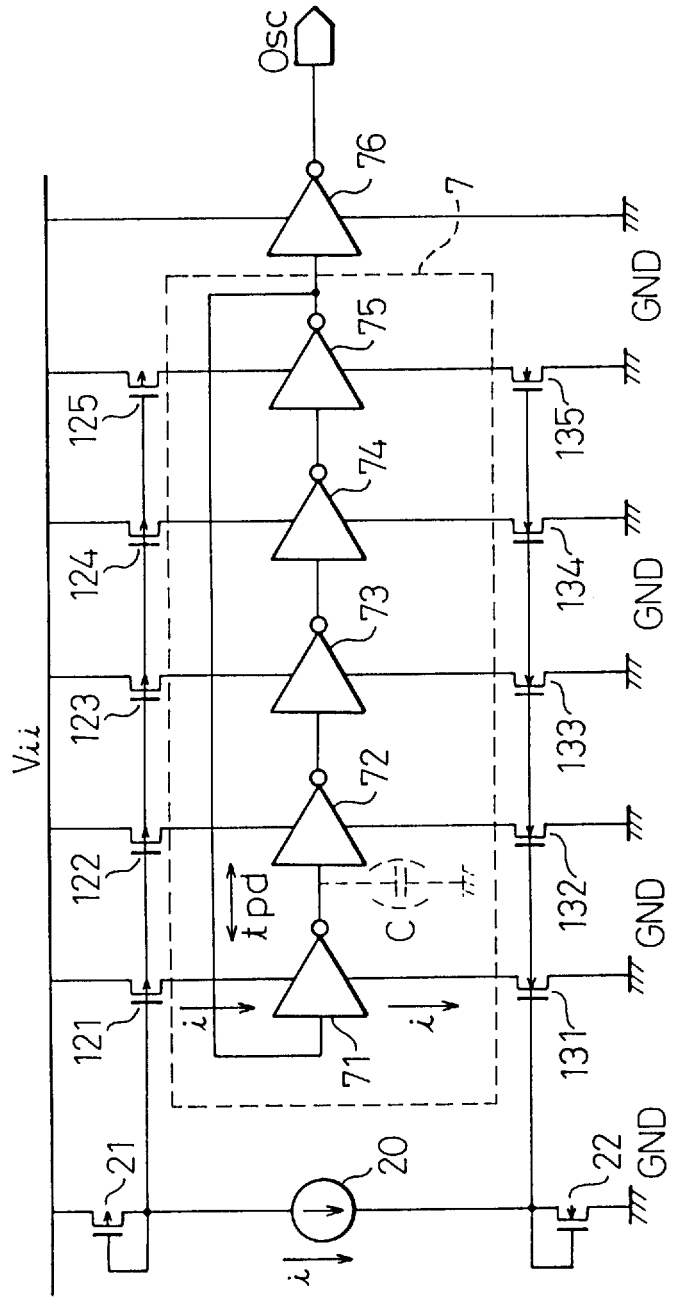

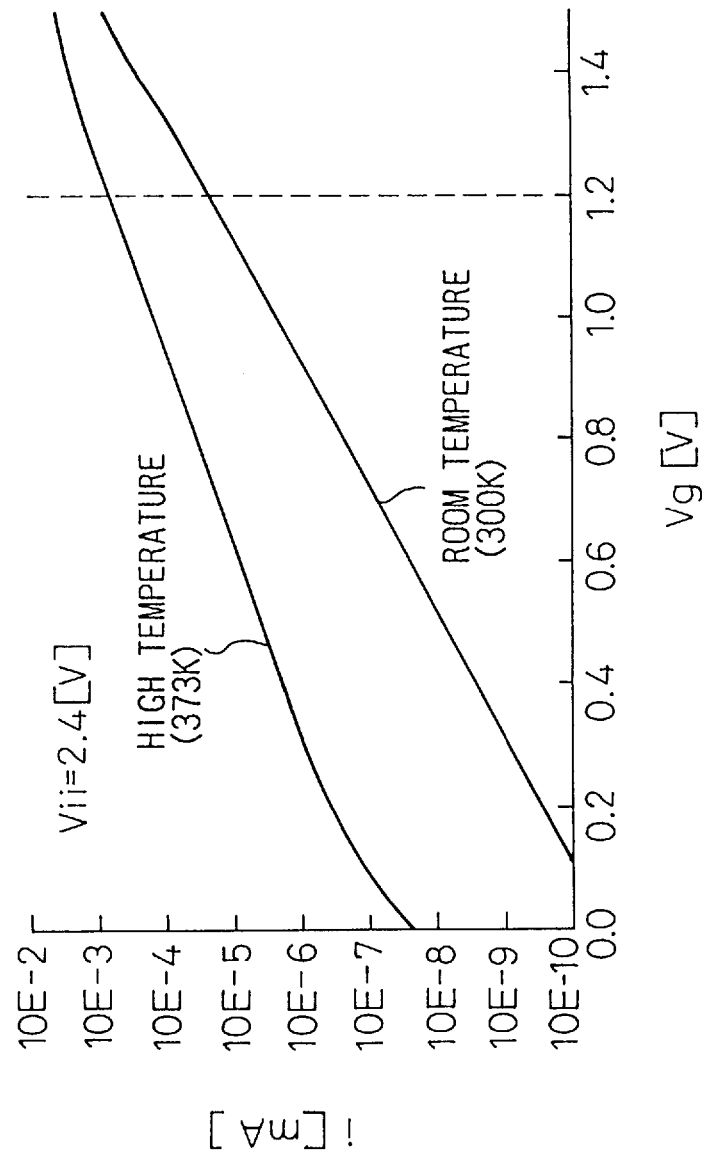

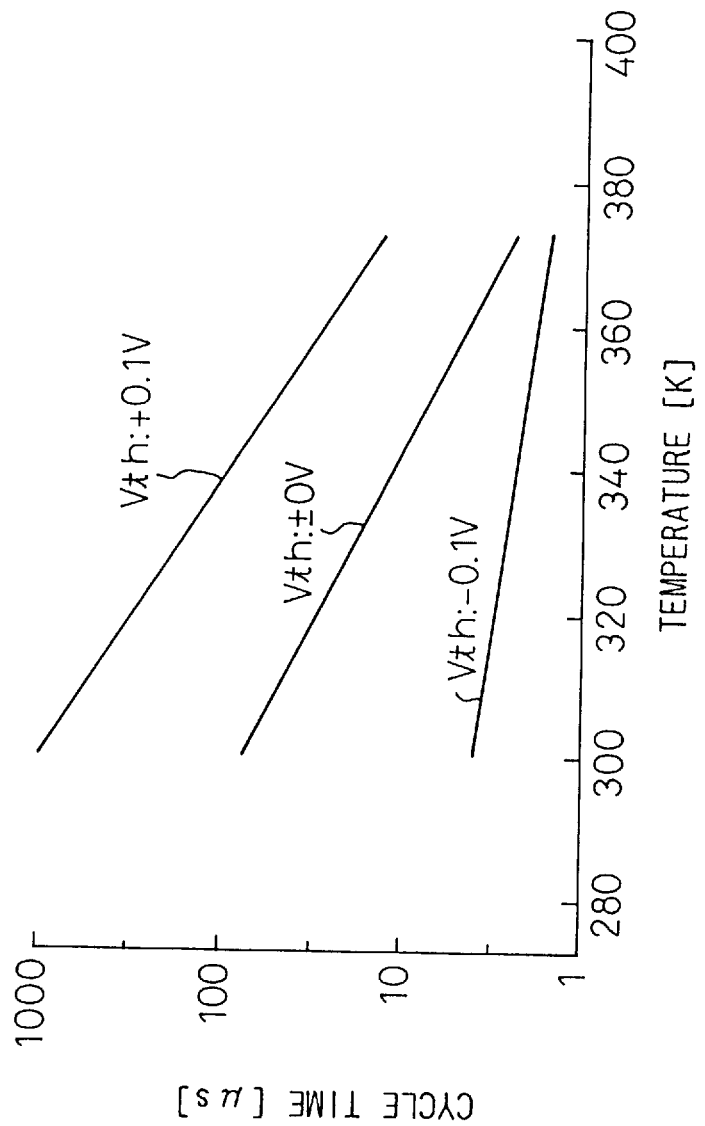

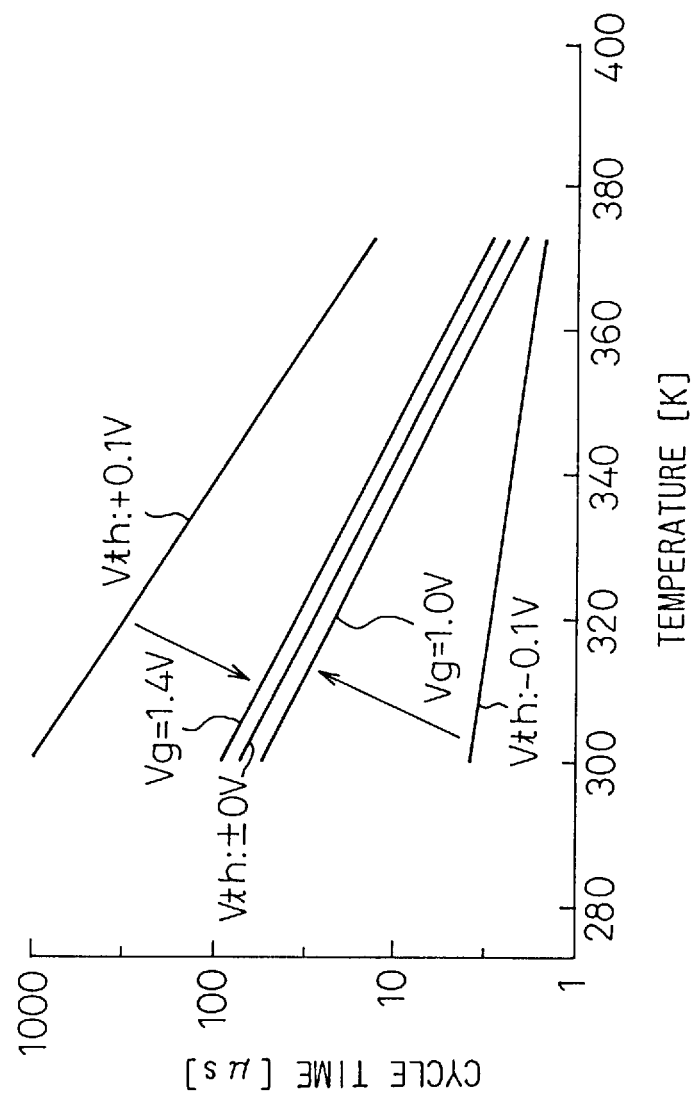

| SETX | RESETX | OUTPUT (SRTJZ) |
|---|---|---|
| H | H | INDEFINITE |
| H | L | L |
| L | H | H |
| L | L | DISABLED |

V0 : OUTPUT VOLTAGE OF BATTERY
V1 : MINIMUM OPERATION VOLTAGE
V2 : MINIMUM EFFECTIVE OPERATION VOLTAGE

SEMICONDUCTOR MEMORY HAVING SELF-REFRESH FUNCTION

BACKGROUND OF THE INVENTION

1. Field of the Invention

The present invention relates to a semiconductor memory, and more particularly, to a semiconductor memory having a self-refresh function.

2. Description of the Related Art

Recently, battery-driven electronic apparatuses such as notebook-type personal computers, word processors, and portable communication devices employ dynamic random access memories (DRAMs) having a self-refresh function to serve the DRAMs as nonvolatile memories.

The battery-driven electronic apparatuses must be of low power consumption to extend battery life. The DRAMs with the self-refresh function employed for these apparatuses must maximize a self-refresh period, to minimize power consumption during a standby time.

In recent years, in a semiconductor memory, a distributed refreshing operation and a collective refreshing operation are carried out.

Namely, the distributed refreshing operation is carried out by uniformly refreshing a memory in a refresh period, and each refresh period involves a plurality of refresh cycles each executing a refresh operation.

On the other hand, the collective refreshing operation is carried out by collectively performing a plurality of refresh cycles in each refresh period, and the refresh period is equal to a period for which a memory cell is able to retain data. The number of refresh cycles is determined to refresh all memory cells.

Note that, a maximum voltage drop in a battery is greater in the collective refreshing than in the distributed refreshing. Namely, the minimum effective operation voltage of the collective refreshing is higher than the minimum effective operation voltage of the distributed refreshing. Both the refreshing methods involve substantially the same average current in each refresh period.

A DRAM consumes current when it carries out a self-refresh operation, to thereby decrease a voltage applied to a system. When the voltage decreases below the operation limit voltage of the system, the system stops to operate. Accordingly, the system must take the voltage drop into consideration.

A semiconductor memory such as a DRAM having a self-refresh function that involves low power consumption during a standby period is disclosed in, for example, Japanese Unexamined Patent Publications 59-56291 and 5-205465. These prior arts reduce power consumption by adjusting a refresh period according to, for example, temperature. The problems of the prior art will be explained hereinafter in detail with reference to the accompanying drawings.

SUMMARY OF THE INVENTION

An object of the present invention is to adjust a self-refresh period of memory cells according to an actual data hold time of the memory cells, to extend battery life as long as possible. Another object of the present invention is to carry out a trimming operation to optimize a self-refresh period of memory cells whose characteristics may differ from one another due to manufacturing unevenness.

According to the present invention, there is provided a semiconductor memory controlling the timing of refreshing a plurality of memory cells, comprising a capacitor for holding charges; a precharge circuit having at least one transistor to precharging the capacitor; and a current source for discharging the capacitor; having a positive temperature coefficient to increase a current to flow as temperature rises, the semiconductor memory controlling the timing of refreshing the memory cells according to a temporal change in a voltage of the capacitor.

The semiconductor memory may be a dynamic random access memory (DRAM) having a self-refreshing function and controlling the timing of self-refreshing the memory cells according to a temporal change in the voltage of the capacitor. The transistor of the precharge circuit may have a first electrode connected to a first power source line, a second electrode connected to an end of the capacitor and an end of the current source, and a control electrode to receive a timing control signal for controlling the switching of the precharge circuit, and wherein the other ends of the capacitor and current source may be connected to a second power source line. The semiconductor memory may further comprise a comparison circuit for comparing the voltage of an end of the capacitor with a reference voltage.

The current source may include a current source transistor operated in a subthreshold region. The current source may further include a minimum current securing circuit connected in parallel with the current source transistor. The minimum current securing circuit may include a minimum current securing transistor having a control electrode connected to the first power source line.

The current source may include a control voltage adjustment circuit for adjusting a control voltage supplied to the control electrode of the current source transistor, to control the temperature coefficient of the current source. The control voltage adjustment circuit may include a first resistor connected to the first power source line, a second resistor connected to the second power source line, and a variable resistor arranged between the first resistor and the second resistor, to provide the control voltage.

The current source may include current source transistors used in a subthreshold region and fuse circuits for selectively connecting the current source transistors, to adjust a current passing through the current source. The current source may further include a minimum current securing circuit connected in parallel with the current source transistors and the fuse circuit. The minimum current securing circuit may include a minimum current securing transistor having a control electrode connected to the first power source line.

The current source transistors may have the same size. The current source transistors may have different sizes. The current source may include a control voltage adjustment circuit for adjusting a control voltage supplied to the control electrodes of the current source transistors, to control the temperature coefficient of the current source. The control voltage adjustment circuit may include a first resistor connected to the first power source line, a second resistor connected to the second power source line, and a variable resistor arranged between the first resistor and the second resistor, to provide the control voltage.

A capacitance of the capacitor may be adjustable. The capacitor may include a plurality of capacitors and a plurality of fuse circuits for selectively connecting the capacitors, to adjust the capacitance of the capacitor. The capacitors may have the same capacitance. The capacitors may have different capacitances. Further, according to the present invention, there is provided a semiconductor memory controlling the timing of refreshing a plurality of memory cells, comprising an oscillation circuit having an oscillation frequency that varies according to a current passing through the oscillation circuit; and a current control circuit having a positive temperature coefficient to increase a current as the temperature rises, for controlling the current passing through the oscillation circuit, to thereby control the timing of refreshing the memory cells.

The semiconductor memory may be a dynamic random access memory (DRAM) having a self-refresh function and controlling the timing of self-refreshing the memory cells. The current control circuit may include a current source having a positive temperature coefficient to increase a current as the temperature rises, a first transistor disposed between the current source and the first power source line, a second transistor disposed between the current source and second power source line, and an oscillation frequency control circuit controlled by the first and second transistors and providing the oscillation circuit with a predetermined current, to control an oscillation frequency of the oscillation circuit.

The oscillation circuit may be a ring oscillator having an odd number of series-connected inverters, the inverters being connected to the first power source line through first control transistors, respectively, the first control transistors being current-mirror-connected to the first transistor, the inverters being connected to the second power source line through second control transistors, respectively, the second control transistors being current-mirror-connected to the second transistor. The output of each of the inverters in the oscillation circuit may be connected to a capacitor.

The current source may include a current source transistor operated in a subthreshold region. The current source may further include a minimum current securing circuit connected in parallel with the current source transistor. The minimum current securing circuit may include a minimum current securing transistor having a control electrode connected to the first power source line.

The current source may include a control voltage adjustment circuit for adjusting a control voltage supplied to the control electrode of the current source transistor, to control the temperature coefficient of the current source. The control voltage adjustment circuit may include a first resistor connected to the first power source line, a second resistor connected to the second power source line, and a variable resistor arranged between the first resistor and the second resistor, to provide the control voltage.

The current source may include current source transistors used in a subthreshold region and fuse circuits for selectively connecting the current source transistors, to adjust a current value passing through the current source. The current source may further include a minimum currents securing circuit connected in parallel with the current source transistors and the fuse circuits. The minimum current securing circuit may include a minimum current securing transistor having a control electrode connected to the first power source line.

The current source transistors may have the same size. The current source transistors may have different sizes. The current source may include a control voltage adjustment circuit for adjusting a control voltage supplied to the control electrodes of the current source transistors, to control the temperature coefficient of the current source. The control voltage adjustment circuit may include a first resistor connected to the first power source line, a second resistor connected to the second power source line, and a variable resistor arranged between the first resistor and the second resistor, to provide the control voltage.

The semiconductor memory may further comprise counters having a trimming function and providing a signal whose frequency is an optional multiple of the oscillation frequency of the output of the oscillation circuit. The counters may be binary counters having a trimming function, initial values to be set in the binary counters being controlled to provide the frequency that is an optional multiple of the oscillation frequency.

BRIEF DESCRIPTION OF THE DRAWINGS

The present invention will be more clearly understood from the description of preferred embodiments as set forth below with reference to the accompanying drawings, wherein:

FIG. 3 is a block diagram showing a whole configuration of a semiconductor memory according to the present invention;

FIGS. 4A and 4B are timing charts explaining the operation of the semiconductor memory of FIG. 3;

FIG. 5 is a circuit diagram showing a current source in the semiconductor memory of FIG. 1;

FIG. 8 is a circuit diagram showing another embodiment of a semiconductor memory according to the present invention;

FIG. 10 is a diagram showing characteristics of a transistor;

FIG. 11 is a diagram showing characteristic curves of transistors having differences in their threshold voltages due to manufacturing unevenness;

FIG. 12 is a diagram showing the correcting of the characteristic curves of transistors having differences in their threshold voltages due to manufacturing unevenness;

DESCRIPTION OF THE PREFERRED EMBODIMENTS

For a better understanding of the preferred embodiments of the present invention, the problem in the prior art will be explained with reference to the drawings.

Figure 31A:
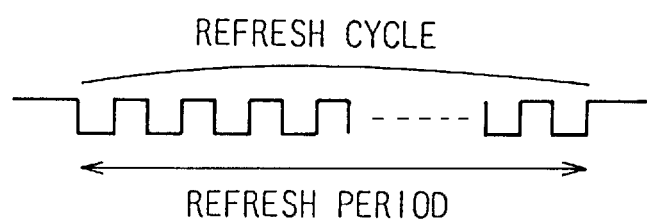
FIGS. 31A and 31B are a diagram for explaining a distributed refresh operation on a semiconductor memory.
Figure 31B:
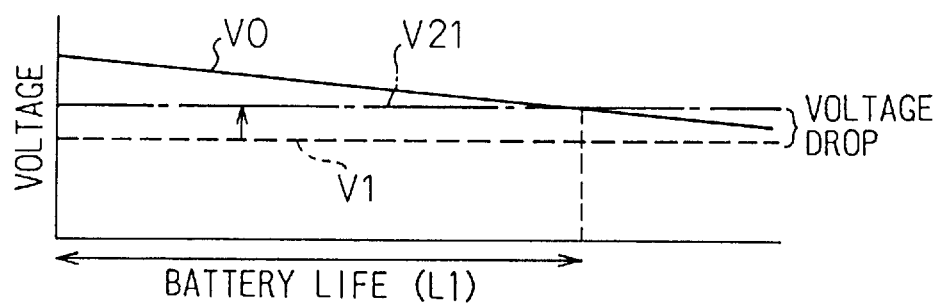
Figure 32A:
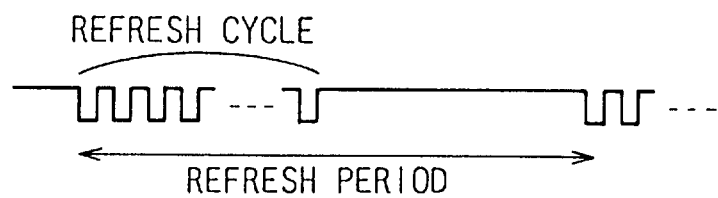
FIGS. 32A and 32B are a diagram for explaining a collective refresh operation on a semiconductor memory.
Figure 32B:
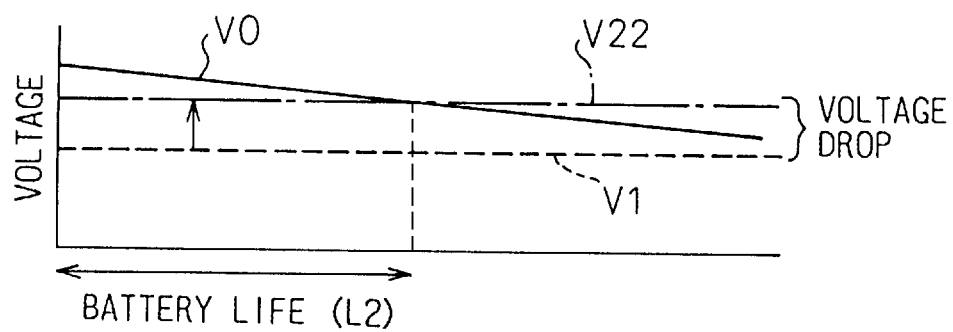

FIGS. 31A and 31B explain the distributed refreshing of a semiconductor memory, and FIGS. 32A and 32B explain the collective refreshing of a semiconductor memory.

The distributed refreshing of FIG. 31A uniformly refreshes a memory in a refresh period of, for example, 65.6 ms. Each refresh period involves, for example, 4096 refresh cycles each executing a refresh operation. Namely, each refresh operation takes 16 μs (=65.6 ms /4096). The collective refreshing of FIG. 32A collectively carries out 4096 refresh cycles in each refresh period of 65.6 ms. The refresh period is equal to a period for which a memory cell is able to retain data. The number of refresh cycles is determined to refresh all memory cells.

As is apparent from comparison between FIGS. 31B and 32B, a maximum voltage drop in a battery is greater in the collective refreshing than in the distributed refreshing. Namely, the minimum effective operation voltage V22 of the collective refreshing is higher than the minimum effective operation voltage V21 of the distributed refreshing. Both the refreshing methods involve substantially the same average current in each refresh period.

DRAMs used for portable equipment driven by battery must have the self-refresh function. The voltage of a battery decreases as a time of use elapses. Battery life ends when the voltage thereof decreases below the operation limit voltage (Vi) of a corresponding system.

A DRAM consumes current when it carries out a self-refresh operation, to thereby decrease a voltage applied to a system. When the voltage decreases below the operation limit voltage of the system, the system stops to operate. Accordingly, the system must take the voltage drop into consideration. Due to the voltage drop, the minimum effective operation voltage V22 of the collective refreshing is higher than the minimum effective operation voltage V21 of the distributed refreshing. As a result, battery life L2 according to the collective refreshing is shorter than battery life L1 according to the distributed refreshing.

Consequently, the distributed refreshing is more advantageous than the collective refreshing in terms of battery life.

A semiconductor memory such as a DRAM having a self-refresh function that involves low power consumption during a standby period is disclosed in, for example, Japanese Unexamined Patent Publications 59-56291 and 5-205465. The former discloses a leak current detecting refresh counter employing two capacitors of different capacitance. The counter detects a change in the voltages of the capacitors and carries out self-refreshing. The latter discloses a self-refresh counter employing a leak monitoring dummy memory cell that has the same structure as an actual memory cell.

These prior arts reduce power consumption by adjusting a refresh period according to, for example, temperature. They, however, must carry out the collective refreshing, and therefore, incapable of maximizing battery life.

The refresh period must be set according to a memory cell that involves the shortest data hold time. Namely, the refresh period must be determined according to a memory cell that involves the largest leak current or the worst condition. A refresh period set by the monitoring dummy cell hardly reflects the data hold time of an actual memory cell. In this way, the prior arts are incapable of setting a refresh period according to the memory cell that involves the largest leak current or the worst condition.

In addition, the prior arts are incapable of trimming a refresh period according to small differences in the characteristics of actual memory cells due to manufacturing unevenness.

Next, semiconductor memories according to preferred embodiments of the present invention will be explained with reference to the drawings.

Figure 1:
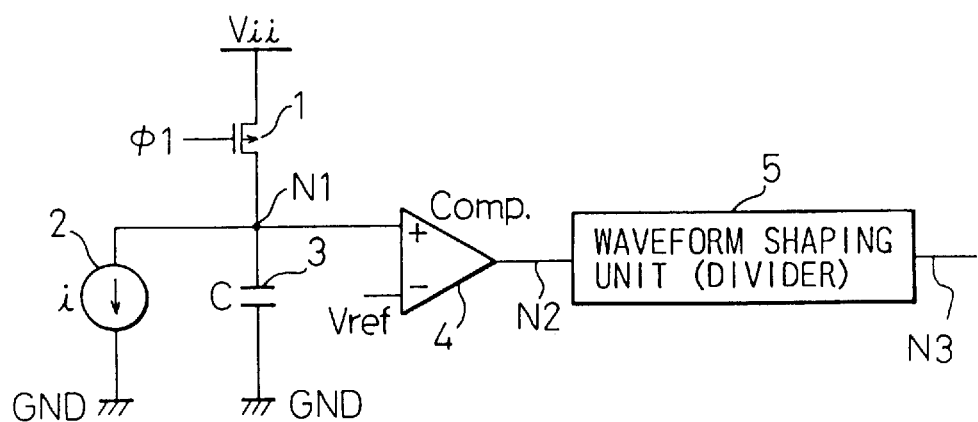
FIG. 1 is a circuit diagram showing a principle of a semiconductor memory according to the present invention.
Figure 2:
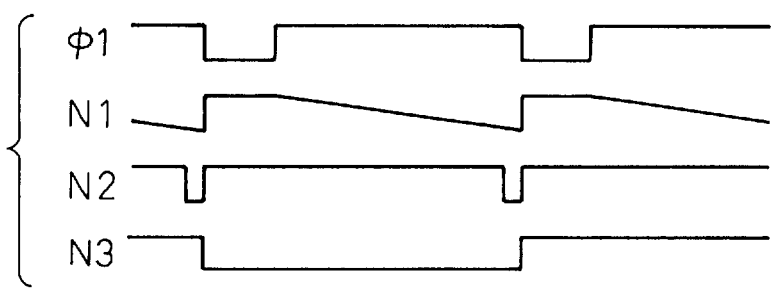
FIG. 2 is a diagram showing waveforms of signals in a semiconductor memory of the present invention.

FIG. 1 is a block diagram showing the principle of a semiconductor memory according to the present invention, and FIG. 2 shows the waveforms of signals in the circuit of FIG. 1. The circuit of FIG. 1 has a precharge transistor 1, a current source 2 having a positive temperature coefficient, a capacitor 3, a comparator 4, and a divider 5 serving as a waveform shaping unit. This circuit involves a precharge timing control signal φ1 and a reference voltage Vref.

The transistor 1 has a source connected to a high-potential power source Vii serving as a first power source, a drain connected to the capacitor 3 that is connected to a low-potential power source GND serving as a second power source, and a gate to receive the precharge timing control signal φ1. A node N1 is connected to the drain of the transistor 1, the capacitor 3, the low-potential power source GND through the current source 2, and a positive input terminal of the comparator 4. A negative input terminal of the comparator 4 receives the reference voltage Vref. The output of the comparator 4 is supplied to a node N2, which is connected to the divider 5. The divider 5 provides a node N3 with a waveform-shaped output.

The current source 2 has a positive temperature coefficient to increase a current "i" when the temperature increases. The current and temperature coefficient of the current source 2 can be trimmed. The transistor 1 is switched in response to the timing control signal $\phi 1$, to precharge the capacitor 3. A current passing through the current source 1 controls the voltage of the capacitor 3, i.e., the voltage of the node N1. The comparator 4 compares the potential of the capacitor 3, i.e., the potential of the node N1 with the reference voltage Vref. The output of the comparator 4 is supplied to the divider 5, which provides the node N3 with a self-refresh timing signal.

When the capacitor 3 is discharged to a certain extent, the voltage of the node N1 becomes smaller than the reference voltage Vref. This state is used to detect the degree of discharge of the capacitor 3. Namely, the comparator 4 compares the voltage of the node N1 with the reference voltage Vref. When the voltage of the node N1 is smaller than the reference voltage Vref, the timing control signal $\phi 1$ is set to low level to turn ON the transistor 1, which precharges the capacitor 3.

Once the capacitor 3 is precharged, the timing control signal $\phi 1$ is set to high level to turn OFF the transistor 1. Then, the current source 2 discharges the capacitor 3. These steps are repeated to provide the node N3 with a signal of required frequency. The divider 5 divides the frequency of a signal at the node N2 and provides a signal whose high and low levels show a duty factor of 1. FIG. 2 shows the levels of signals at the node N1 to N3 and the level of the timing control signal $\phi 1$.

A period P in which the voltage of the node N1 changes from the precharge voltage Vii to the reference voltage Vref is expressed as follows:

$$P = C \cdot (Vii - Vref)/i \quad (1)$$

where C is the capacitance of the capacitor 3 and "i" is a current passing through the current source 2. Accordingly, the period P is adjustable by changing the current i or capacitance C. The present invention trims the current i passing through the current source 2 or the capacitance C of the capacitor 3, to optimize a self-refresh period against a temperature change or manufacturing unevenness, thereby maximizing battery life.

As explained above, a semiconductor memory according to the present invention has the current source 2 having a positive temperature coefficient, the capacitor 3 for holding charges, and the precharge circuit having the transistor 1, which is turned ON and OFF in response to the timing control signal $\phi 1$, to precharge the capacitor 3. This memory determines the timing of self-refreshing according to a temporal change in the voltage of the capacitor 3.

FIG. 3 is a block diagram showing a semiconductor memory, i.e., a DRAM having a refresh function according to the present invention, and FIGS. 4A and 4B are timing charts for explaining the operation of the memory of FIG. 3.

The memory of FIG. 3 has an address decoder 101, a word decoder 102, a sense amplifier 103, a memory cell array 104, a controller 105, a CBR decision circuit 106, a self-refresh decision circuit 107, an internal address generator 108, a self-refresh signal generator 109, and selectors 110 and 111. The memory cell array 104 includes bit lines BL, word lines WL, and memory cells MC that are formed at the intersections of the bit and word lines. Each of the memory cells consists of a transistor and a capacitor.

The essential part of the semiconductor memory of the present invention shown in FIGS. 1 and 2 corresponds to the self-refresh signal generator 109, which generates an internal clock signal /RAS'.

FIG. 4A shows a normal operation mode of the memory. Under this mode, a row address strobe signal /RAS and a column address strobe signal /CAS are successively activated. Namely, they are set to low level, and a read or write operation is carried out according to the logic of a write enable signal /WE or output enable signal /OE.

FIG. 4B shows a self-refresh mode of the memory. Under this mode, the signals /CAS and /RAS are successively set to low level. This is called a CAS-before-RAS refresh state. This state is maintained for at least 100 $\mu$s, to start the self-refresh mode.

Under the normal operation mode, the external signal /RAS and an external address signal ADD are sent as they are to the inside of the memory. Under the self-refresh mode, internally generated signals /RAS' and ADD' are employed for internal operations. The signal /RAS' is an output signal from the self-refresh signal generator 109, and the signal ADD' is an output signal from the internal address generator 108.

Under the normal operation mode of FIG. 4A, the signal /RAS is set to low level from high level. The CBR decision circuit 106 determines whether it is the CBR (CAS-before-RAS) state. Under the normal operation mode, the signal /CAS is not yet dropped to low level, so that it is not the CBR state. The result of the CBR decision is provided as a signal "cbr," which is set to high level in response to the CBR state. Accordingly, the external signals /RAS and ADD are supplied as they are to the inside of the memory under the normal operation mode.

Under the self-refresh mode of FIG. 4B, the signal /CAS is firstly dropped to low level from high level, and thereafter, the signal /RAS is dropped to low level. The CBR decision circuit 106 determines that it is the CBR state and raises the signal cbr to high level. At this time, a signal "ras" is equal to the external signal /RAS. A signal "add," however, is not the external address signal ADD but is an internal address signal ADD'. Namely, in response to the output signal cbr of the CBR decision circuit 106, the selector 111 switches the external address signal ADD to the internal address signal ADD'. If this CBR state is maintained for at least 100 $\mu$s, the self-refresh decision circuit 107 raises a signal "srj" to high level to start the self-refresh mode. At this time, the internal signal /RAS' is used as the signal ras. Namely, in response to the output signal srj of the self-refresh decision circuit 107, the selector 110 switches the external signal /RAS to the internal signal /RAS'. The internal address signal ADD' is incremented in synchronization with the signal /RAS' provided by the self-refresh signal generator 109.

Figure 6:
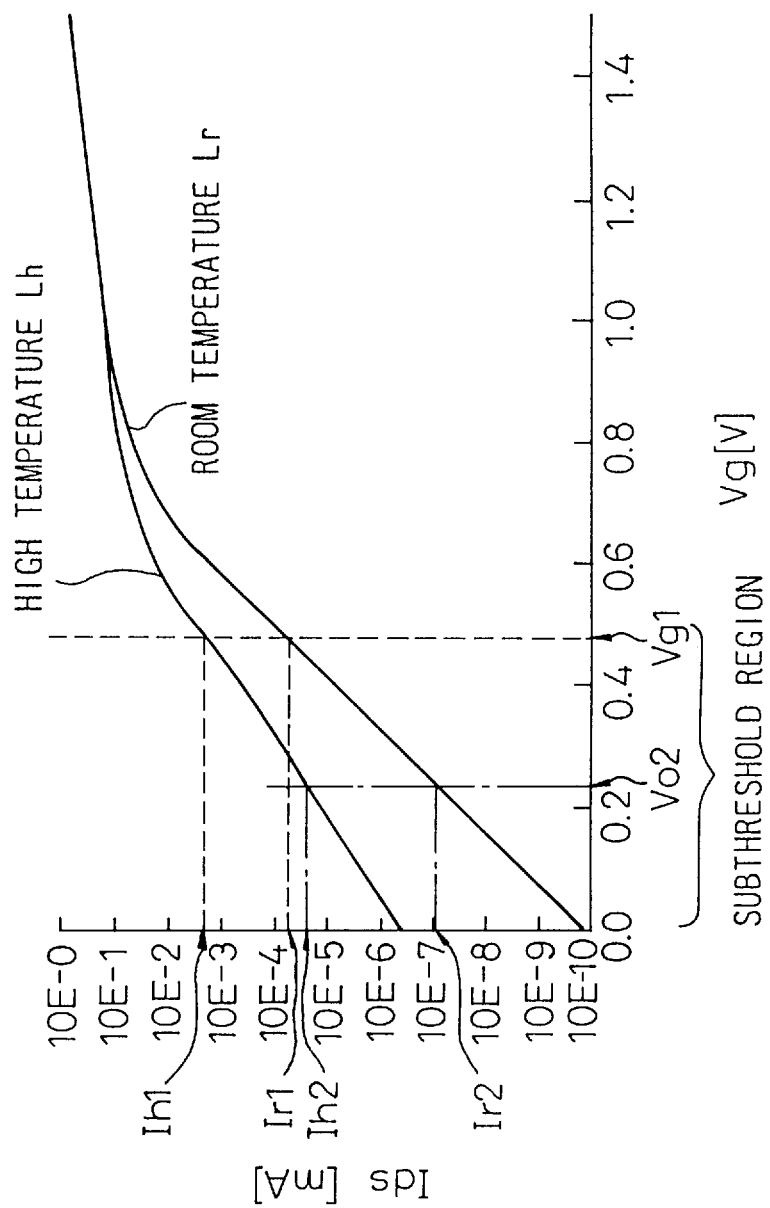
FIG. 6 is a diagram showing the characteristics of the current source of FIG. 5.

FIG. 5 is a circuit diagram showing an example of the current source 2 of the semiconductor memory of FIG. 1, and FIG. 6 shows the characteristics of the current source 2 of FIG. 5. The current source 2 has a positive temperature coefficient. The current and temperature coefficient of the current source 2 are adjustable.

In FIG. 5, the current source 2 has transistors 211 to 21n, fuses 221 to 22n, resistors 23 and 25, and a variable resistor 24. Each pair of the transistors and fuses such as 211 and 221, 212 and 222, and 21n and 22n is connected in series between the node N1 and the low-potential power source GND. A required number (m) of the fuses are blown out to connect "n - m" transistors in parallel with one another between the node N1 and the power source GND. The fuses 221 to 22n are used to determine the number of transistors serving as a current source among the transistors 211 to 21n and adjust the current "i." The temperature coefficient of the current "i" is properly set by adjusting a voltage Vg.

To provide the current "i" flowing through the transistors 211 to 21n with a positive temperature coefficient, the transistors 211 to 21n are operated in a subthreshold region. The transistors 211 to 21n may have the same size or different sizes. Differing the sizes of the transistors 211 to 21n may reduce the number of fuses to be blown out to obtain a required current, or be advantageous in accurately setting the current.

FIG. 6 shows a relationship between the gate-source voltage (gate voltage) Vg of a transistor and the drain-source current Ids (log(Ids)) thereof. In the subthreshold region where the voltage Vg is below a threshold voltage, the logarithm of the current Ids is proportional to the voltage Vg, and the gradient of a characteristic curve representing the relationship becomes smaller as the temperature increases. An intersection between the characteristic curve and the voltage Vg is the current Ids. The gradient of a high-temperature characteristic curve Lh differs from that of a room-temperature characteristic curve Lr. Accordingly, it is possible to adjust the ratio (temperature coefficient) of a current at the high temperature to a current at the room temperature. Namely, the ratio of a current value Ih1 at the high temperature to a current value Ir1 at the room temperature under a voltage Vg1 differs from the ratio of a current value Ih2 at the high temperature to a current value Ir2 at the room temperature under a voltage Vg2. Accordingly, the temperature coefficient is adjustable by changing the voltage Vg.

Figure 7:
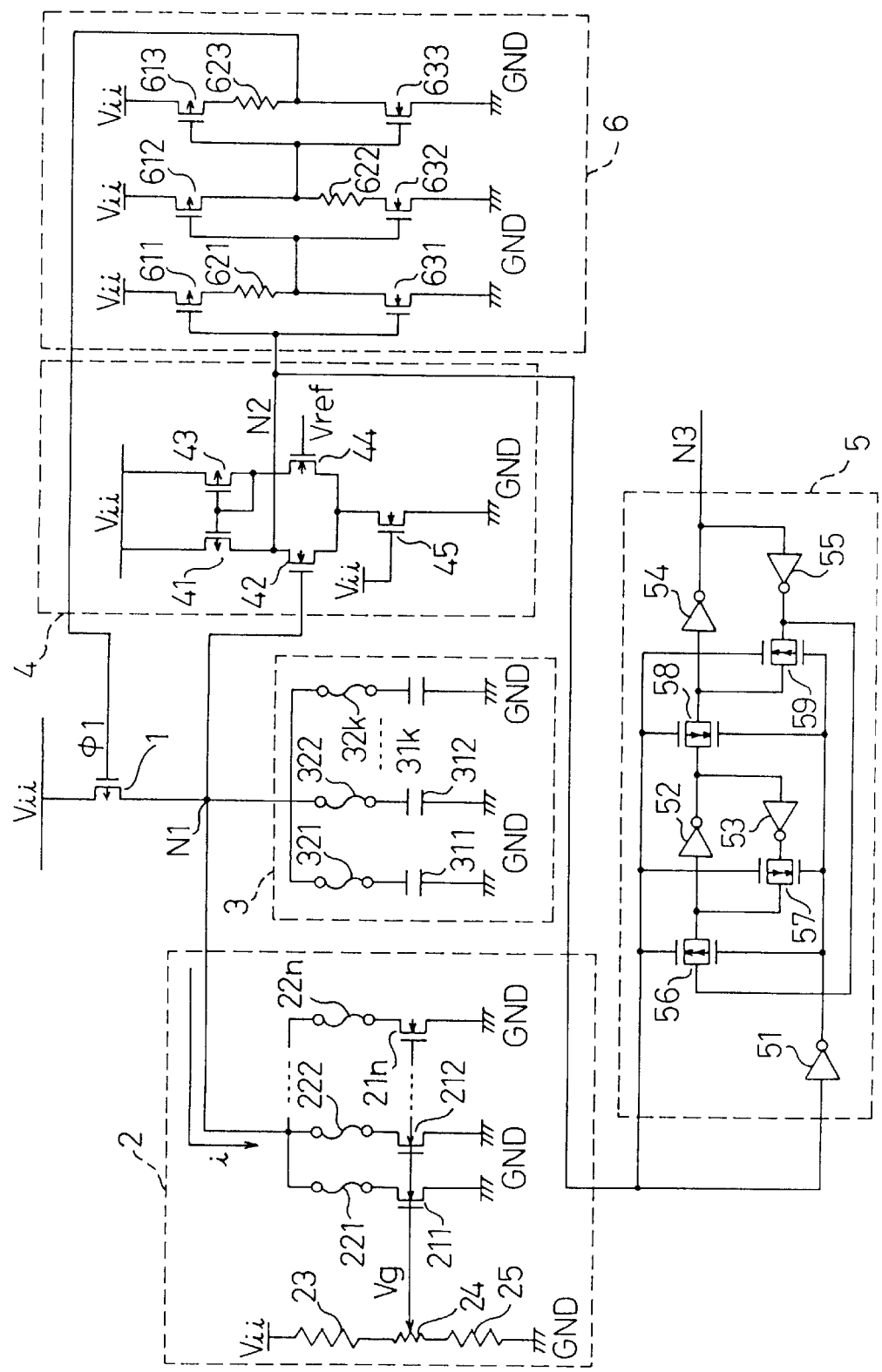
FIG. 7 is a circuit diagram showing an embodiment of a semiconductor memory according to the present invention.

FIG. 7 is a circuit diagram showing a semiconductor memory according to the present invention. A current source 2 of this memory is capable of trimming a current and a temperature coefficient as explained with reference to FIGS. 5 and 6.

In FIG. 7, a capacitor 3 corresponding to the capacitor 3 of FIG. 1 has capacitors 311 to 31k and fuses 321 to 32k. Each pair of the capacitors and fuses such as 311 and 321, 312 and 322, and 31k and 32k is connected in series between a node N1 and a low-potential power source GND. A required number (j) of the fuses 321 to 32k are blown out to connect "k - j" capacitors in parallel with one another between the node N1 and the power source GND. Namely, the fuses 321 to 32k are used to determine the number of capacitors to be used among the capacitors 311 to 31k, to adjust the total capacitance of the capacitor 3.

A comparator 4 consists of p-channel MOS transistors 41 and 43 and n-channel MOS transistors 42, 44, and 45 and amplifies a difference between the voltage of the node N1 and a reference voltage Vref. The output of the comparator 4 is supplied to a divider 5 and a pulse extender 6 through a node N2. The divider 5 is a frequency divider serving as a waveform shaping unit.

The divider 5 consists of inverters 51 to 55 and transfer gates 56 to 59 each having p- and n-channel MOS transistors. The divider 5 halves the frequency of the output of the comparator 4, shapes the waveform of the frequency-halved signal, and provides a node N3 with the shaped output. The pulse extender 6 is formed of three inverters consisting of p-channel MOS transistors 611 to 613, n-channel MOS transistors 631 to 633, and resistors 621 to 623. The pulse extender 6 extends each output pulse from the comparator 4 and provides the gate of a precharging p-channel transistor 1 with a timing control signal φ1.

The operation of the circuit of FIG. 7 will be explained. The node N1 is precharged to the voltage Vii through the transistor 1. The capacitor 3 accumulates charges of Vii×C where C is the total capacitance of the capacitor 3 connected to the node N1. After the node Ni is precharged, the transistor 1 is turned OFF. Then, the current source 2 discharges the capacitor 3. The discharge quantity Qdis of the capacitor 3 is expressed as follows:

$$Qdis=i \times tdis \qquad (2)$$

where "tdis" is a discharge time and "i" is a current. At this time, the voltage Vn1(t) of the node N1 is expressed as follows:

$$Vn1(t)=Vii-i \times tdis/C \qquad (3)$$

In this way, the potential of the node N1 decreases as time passes. A decrease in the potential of the node N1 is proportional to the current i passing through the current source 2.

The comparator 4 compares the voltage of the node N1 with the reference voltage Vref, which is lower than the voltage Vii. If the voltage of the node N1 is lower than the reference voltage Vref, the output of the comparator 4 at the node N2 inverts to indicate that the capacitor 3 has been discharged to a predetermined level. In response to this output signal of the comparator 4, the pulse extender 6 provides the gate of the precharging transistor 1 with the timing control signal φ1 to turn ON the transistor 1, which again precharges the node N1. These processes are repeated to set the timing of refreshing.

The pulse extender 6 extends each pulse to secure a precharge time at the node N1. The divider 5 shapes the waveform of the output of the comparator 4 and provides a signal whose duty factor of high and low levels is 1. The comparator 4 for comparing the voltage of the node N1 with the reference voltage Vref is not essential. For example, an inverter whose threshold is the voltage Vref may be employed instead of the comparator 4.

FIG. 8 is a circuit diagram showing another semiconductor memory according to the present invention. This memory employs current mirror connections to control the charge-discharge current of each of inverters that form a ring oscillator. The memory includes p-channel MOS transistors 21 and 121 to 125, n-channel MOS transistors 22 and 131 to 135, and inverters 71 to 76.

The source of the transistor 21 is connected to a high-potential power source Vii, and the source of the transistor 22 is connected to a low-potential power source GND. The gate and drain of the transistor 21 are connected to one end of a current source 20, and the gate and drain of the transistor 22 are connected to the other end of the current source 20. Accordingly, a current "i" passing through the current source 20 also passes through the transistors 21 and 22.

The five inverters 71 to 75 form the ring oscillator 7. The inverters 71 to 75 are connected to the power source Vii through the transistors 121 to 125, respectively, and to the power source GND through the transistors 131 to 135, respectively. The transistors 121 to 125 are current-mirror-connected to the transistor 21, and the transistors 131 to 135 are current-mirror-connected to the transistor 22. Namely, the current i passing through the transistor 21 also passes through the transistors 121 to 125. Similarly, the current i passing through the transistor 22 also passes through the transistors 131 to 135. Consequently, the current i passing through the current source 20 passes the inverters 71 to 75 that form the ring oscillator 7. The inverter 76 shapes the waveform of the output of the ring oscillator 7.

The current source 20 has the same arrangement as the current source 2 of FIG. 5. Namely, fuses (221 to 22n) control the number of transistors (211 to 21n) serving as a current source, to adjust the current i. The gate voltage Vg of each of the transistors (211 to 21n) is adjusted to properly set the temperature coefficient of the current i, as shown in FIG. 6. In FIG. 8, the charge-discharge current of each of the inverters 71 to 75 of the ring oscillator 7 is equalized with and controlled by the current passing the current source 20. At this time, the delay "tpd" of one inverter is expressed as follows:

$$tpd = C \cdot Vii/i \qquad (4)$$

where C is the load capacitance of each inverter. The temperature coefficient of an inverted current i-i must be equal to the data hold time tREF of the ring oscillator 7. The data hold time tREF is a time in which a capacitor of a memory cell is discharged to require the next refresh operation.

Figure 9A:
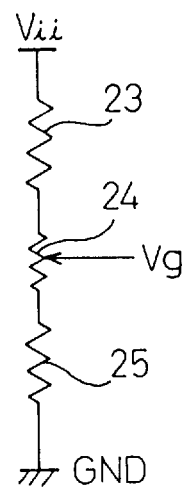
FIGS. 9A and 9B are circuit diagrams showing current sources for a semiconductor memory according to the present invention.
Figure 9B:
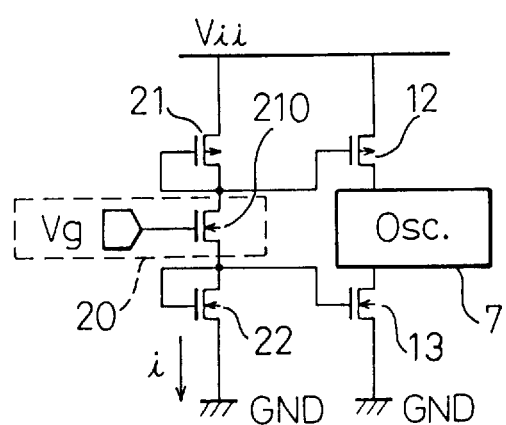

FIGS. 9A and 9B are circuit diagrams showing current sources used for a semiconductor memory according to the present invention. FIG. 10 shows the characteristics of a transistor. The circuit of FIG. 9A adjusts the voltage Vg of FIG. 5, and the circuit of FIG. 9B has an n-channel MOS transistor 210 arranged between transistors 21 and 22.

In FIG. 9B, the transistor 210 is arranged between the transistors 21 and 22, and the ring oscillator 7 (FIG. 8) is connected to a high-potential power source Vii through a transistor 12, which is current-mirror-connected to the transistor 21. The ring oscillator 7 is also connected to a low-potential power source GND through a transistor 13, which is current-mirror-connected to the transistor 22.

It is supposed that an inverted current $i^{-1}$ of the current source has the same temperature coefficient as the data hold time tREF of the ring oscillator 7. The temperature coefficient of the data hold time tREF is, for example, two times/decade, and the temperature coefficient of a transistor operating in a subthreshold region is used. FIG. 10 shows a relationship between the voltage Vg and the current i of the circuit of FIG. 9B. In FIG. 9B, the transistor 210 is used in a subthreshold region, to form the current source (2).

If the gate voltage Vg is 1.2 V, the current i is nearly $10^{-5}$ A at 300 K in temperature and nearly $10^{-3}$ at 373 K in temperature. Namely, the inverted current $i^{-1}$ is nearly equal to the temperature coefficient of the data hold time tREF. In FIG. 9A, the gate voltage Vg is produced by dividing the voltage Vii by the resistors 23 to 25 and is adjustable by the variable resistor 24. This may correct differences in the characteristics (threshold voltages) of transistors due to manufacturing unevenness. Namely, the temperature coefficient of the current i is adjustable by changing the gate voltage Vg.

FIG. 11 shows characteristic curves of transistors having different threshold voltages due to manufacturing unevenness. This shows the temperature dependency of a cycle time of a temperature compensating ring oscillator. The manufacturing unevenness fluctuates the threshold voltages of p- and n-channel MOS transistors. The characteristic curves of FIG. 11 are of transistors whose threshold voltages Vth involve fluctuations of +−0 V (no fluctuation), −0.1 V, and +0.1 V, respectively.

As is apparent in FIG. 11, even a fluctuation of +−0.1 V in the threshold voltage of a transistor greatly changes a characteristic curve representing the cycle time and temperature of the transistor. This fluctuation is compensated by adjusting a gate voltage (Vg) according to the present invention.

FIG. 12 shows a correction of such a fluctuation in the threshold voltage of a transistor caused by manufacturing unevenness. A fluctuation in the range of +−0.1 V in the threshold voltage of a transistor will be compensated by adjusting a gate voltage Vg applied to the transistor.

If the threshold voltage of a transistor involves a fluctuation of +0.1 V, a gate voltage Vg applied to the transistor is set to 1.4 V, to substantially equalize the characteristic curve of the transistor to an ideal characteristic curve with no fluctuation in the threshold voltage Vth. If the threshold fluctuation is −0.1 V, the gate voltage Vg is set to 1.0 V, to substantially equalize the characteristic curve of the transistor to the ideal characteristic curve.

Figure 13A:
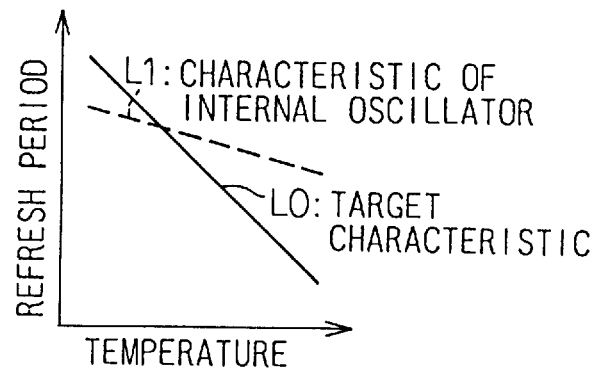
FIGS. 13A, 13B, and 13C are diagrams for explaining a trimming operation on a semiconductor memory according to the present invention.
Figure 13B:
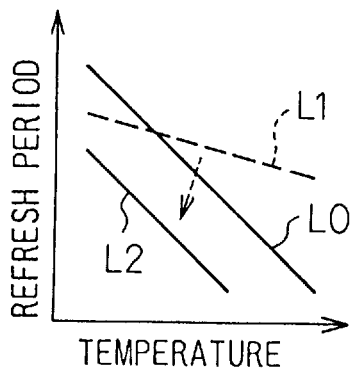
Figure 13C:
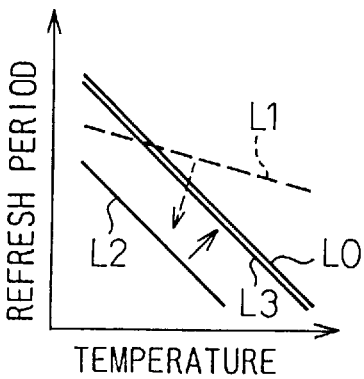

FIGS. 13A, 13B, and 13C explain a trimming process in a semiconductor memory according to the present invention. FIG. 13A shows the characteristic curve (a refresh period) L1 of an internal oscillator without trimming on temperature, and a target characteristic curve L0. FIG. 13B shows a characteristic curve L2 with a trimmed gate voltage Vg. FIG. 13C shows a characteristic curve L3 with trimmed capacitors or transistors.

The trimming is carried out to adjust the characteristics of a self-refresh oscillator according to a refresh period of memory cells of a DRAM having a self-refresh function. The trimming is also carried out to adjust the temperature dependency (temperature coefficient) of the memory cells. To extend battery life, the distributed self-refresh operation is preferable. Accordingly, the oscillation characteristic (oscillation period) of an oscillator is adjusted according to "refresh period/refresh cycles."

As shown in FIGS. 13A to 13C, the trimming is carried out in three steps. In FIG. 13A, the temperature dependency of a refresh period of memory cells and the oscillation characteristic curve (L1) of the self-refresh oscillator are measured. The temperature dependency of the refresh period is defined as a target oscillation characteristic curve (L0).

In FIG. 13B, the temperature coefficient (gradient) of the oscillation characteristic curve (L1) of the self-refresh oscillator is adjusted to the temperature coefficient of the target characteristic curve (L0) by adjusting the gate voltage Vg, thereby providing the oscillation characteristic curve (L2). More precisely, the gradient is enlarged by lowering the gate voltage Vg from an original value, or is reduced by increasing the gate voltage Vg from the original value.

Once the gradient is adjusted as shown in FIG. 13C, the refresh period is adjusted to the target characteristic by translation. Namely, the capacitance (C) of capacitors or the number (or size) of transistors is trimmed, to obtain an oscillation characteristic curve (L3). To translate a characteristic curve downwardly, the number of transistors is increased by reducing the number of fuses to be blown out, or the capacitance of capacitors is decreased by increasing the number of fuses to be blown out. To translate a characteristic upwardly, the number of transistors is reduced, or the capacitance of capacitors is increased. When large-sized transistors are used and when fuses for the large-sized transistors are left as they are, the characteristic curve is translated downwardly.

The refresh period may be trimmed by employing frequency dividers as mentioned later. To carry out the distributed self-refresh operation, the refresh period will be "refresh period/refresh cycles." FIGS. 14A, 14B, 15A, 15B, and 15C explain the trimming of resistors in a semiconductor memory according to the present invention.

A gate voltage Vg applied to transistors must be constant and independent of temperature. The circuits of FIGS. 14A and 14B employ divided resistors to adjust the gate voltage Vg.

Figure 14A:
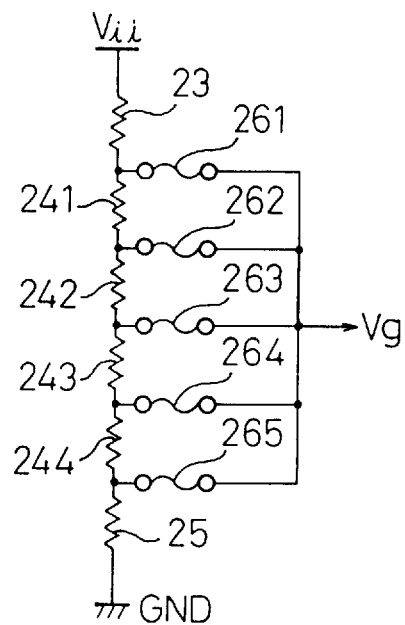
FIGS. 14A and 14B are diagrams for explaining a trimming operation on resistors of a semiconductor memory according to the present invention.

In FIG. 14A, resistors 23, 241 to 244, and 25 have the same resistance and are connected in series between a high-potential power source Vii and a low-potential power source GND. An optional node may provide the gate voltage Vg through one of fuses 261 to 265. Although FIG. 14A shows six series-connected resistors, required "n" resistors may be connected in series. A fuse to provide a required gate voltage Vg is left and the other fuses are blown out. The voltage Vg is adjustable in the range of Vii/n to Vii(n-1)/n at intervals of Vii/n. The fuses will be blown out by a laser beam or a high voltage.

Figure 14B:
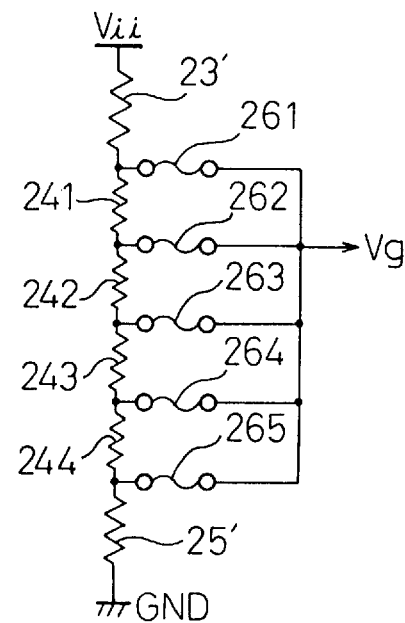

The circuit of FIG. 14B is suitable for accurately adjusting the gate voltage to a target value. Resistors 23' and 25' have large resistance compared with the resistors 23 and 25 of FIG. 14A.

Each resistor has temperature dependency. If each resistor is made from the same material, each will have the same temperature coefficient. The circuits of FIGS. 14A and 14B produce the gate voltage Vg by dividing resistors (resistance ratio), to cancel the temperature dependency. As a result, the gate voltage Vg is independent of temperature. Each of these circuits passes a direct current, i.e., a through current. To reduce power consumption of the memory, the through current must be reduced to several microamperes. More precisely, the resistance of each of the resistors 23, 25, 261 to 265, etc., is set to several hundreds of kiloohms to several tens of megaohms.

Figure 15A:
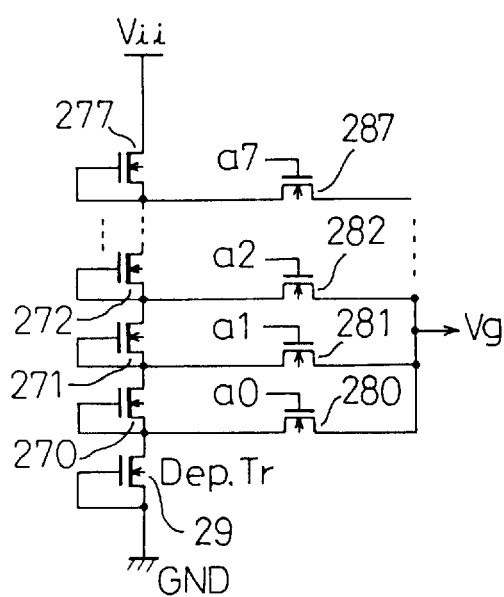
FIGS. 15A, 15B, and 15C are diagrams for explaining a trimming operation on resistors of a semiconductor memory according to the present invention.
Figure 15B:
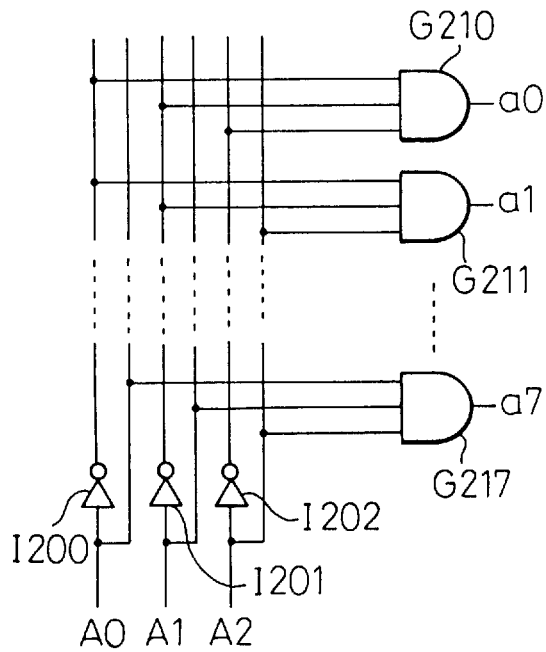
Figure 15C:
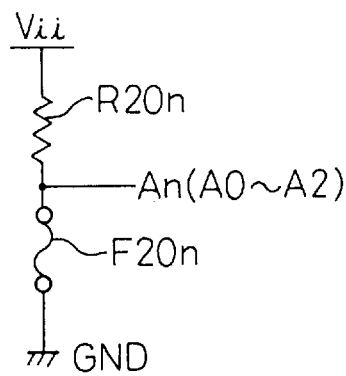

FIG. 15A shows a circuit employing depletion transistors 270 to 277 instead of the resistors of FIGS. 14A and 14B, and electrical switching elements (transistors) 280 to 287 instead of the fuses of FIGS. 14A and 14B. FIG. 15B shows a circuit for generating signals to control the switching transistors of FIG. 15A. FIG. 15C shows a circuit for generating signals for the circuit of FIG. 15B.

In FIG. 15A, the depletion transistors 29 and 270 to 277 are connected in series between power sources GND and Vii. The source and drain of each of the depletion transistors 29 to 270 are connected to each other. An optional node among the transistors 270 to 277 provides a required gate voltage Vg through a corresponding one of the switching transistors 280 to 287. Although the circuit of FIG. 15A employs eight series-connected transistors, the number of the transistors is optional.

Employing transistors (270 to 277) instead of resistors (23, 25, 261 to 265) as shown in FIG. 15A is advantageous in reducing a layout area because resistors having large resistance occupy a large area. Namely, a transistor serving as a resistor provides large resistance with a relatively small area, to help reduce a layout area.

The circuit of FIG. 15B decodes three bits A0, A1, and A2, to generate control signals a0 to a7, which are supplied to the eight switching transistors 280 to 287, respectively. The circuit of FIG. 15B has three inverters I200, I201, and I202, and eight AND gates G210 to G217. Any bit An among the three bits A0, A1, and A2 is produced by the circuit of FIG. 15C having a resistor R20n and a fuse F20n. The resistor R20n has a high resistance of, for example, several megaohms. The circuits of FIGS. 15B and 15C are only examples. Various circuits will be formed by combining known techniques.

To obtain the gate voltage Vg from, for example, the switching transistor 282 of FIG. 15A, the bits A0, A1, and A2 of FIG. 15B are set to low, low, and high levels, respectively, to make the control signal a2 alone high level. Then, only the switching transistor 282 is turned ON. In this case, only a fuse of a circuit corresponding to the bit A2 is blown out in FIG. 15C.

Figure 16A:
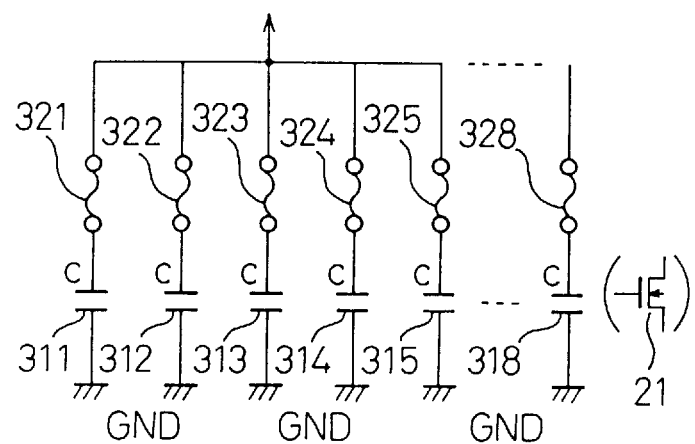
FIGS. 16A and 16B are diagrams for explaining a trimming operation on capacitors (transistors) of a semiconductor memory according to the present invention.
Figure 16B:
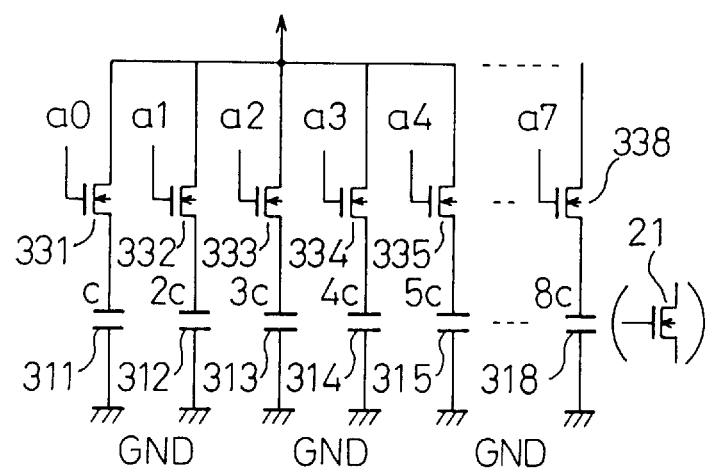

FIGS. 16A and 16B explain the trimming of capacitors (transistors) of a semiconductor memory according to the present invention. In FIG. 16A, capacitors 311 to 318 are selected by fuses 321 to 328. In FIG. 16B, capacitors 311 to 318 are selected by switching transistors 331 to 338. The trimming of transistors (21, 211 to 21n) is basically the same as the trimming of the capacitors 211 to 318, so that the trimming of capacitors will be explained.

As explained above (for example, FIG. 13C), the trimming of the capacitors (transistors) 311 to 318 adjusts a refresh period, i.e., the oscillation frequency of an oscillator. In FIG. 16A, ones of the fuses 321 to 328 corresponding to required ones of the capacitors 311 to 318 are left and the other fuses are blown out to adjust capacitance. The capacitors 311 to 318 of FIG. 16A have the same capacitance, and those of FIG. 16B have different capacitance. The capacitance of the capacitors 311 to 318 of FIG. 16B may be 1C, 2C, 3C, 4C, and the like that increase at intervals of C, or they may be 1C, 2C, 4C, 8C, and the like that increase by two times. The capacitors having different capacitance are advantageous in accurately adjusting total capacitance.

When the threshold voltages of transistors (21, 211 to 21n) are set at large intervals and the capacitance of capacitors (3, 311 to 318) is set at small intervals, the trimming of the transistors provides a rough adjustment and the trimming of the capacitors provides a fine adjustment. It is possible to set the threshold voltages of the transistors at fine intervals and the capacitance of the capacitors at rough intervals. It is preferable to set the capacitance of the capacitors at fine intervals because the capacitors usually need a large area.

The trimming of refresh cycles of a DRAM having a refresh function will be explained with reference to FIGS. 17 to 30. The trimming of refresh cycles to be explained below is applicable to the circuits of FIGS. 1, 7, and 8.

Figure 17:
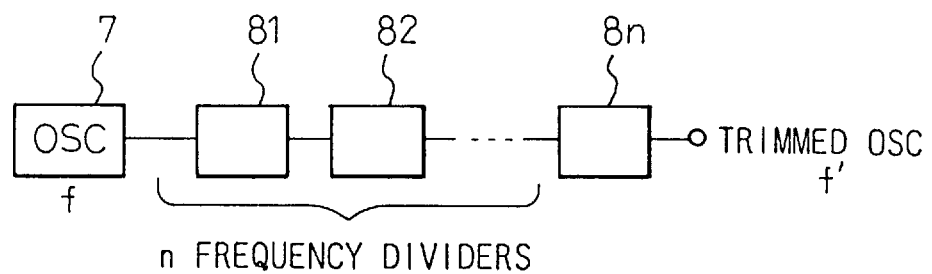
FIG. 17 is a diagram for explaining a principle of a trimming operation on refresh cycles of a semiconductor memory according to the present invention.

FIG. 17 explains the principle of trimming refresh cycles in a semiconductor memory according to the present invention. The arrangement of FIG. 17 includes an oscillator 7 such as a ring oscillator and frequency dividers 81 to 8n.

The frequency dividers 81 to 8n are capable of adjusting the original oscillation frequency "f" of the oscillator 7 up to $2^n$ times. Namely, the arrangement of FIG. 17 adjusts the original oscillation frequency f at intervals of two times such as 2, 4, 8, ..., $2^n$. The present invention employs binary counters having a trimming function, to adjust the original frequency f to f, 2f, 3f, ..., $2^n$f at intervals of f.

Figure 18A:
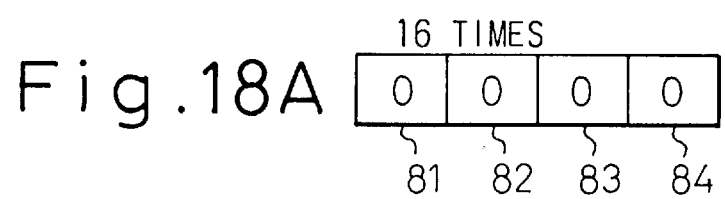
FIGS. 18A, 18B, and 18C are diagrams for explaining the operation of binary counters having a trimming function.
Figure 18B:
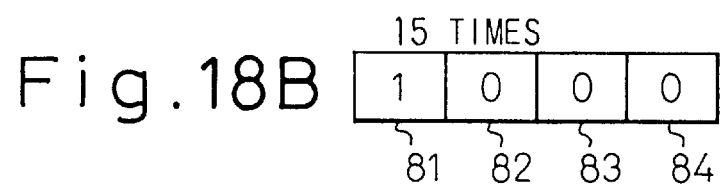
Figure 18C:
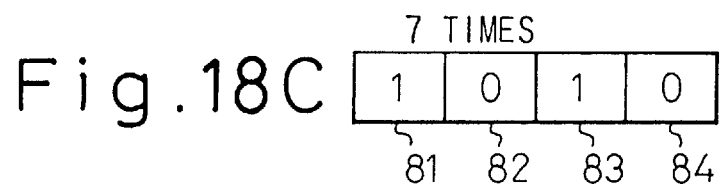

FIGS. 18A, 18B, and 18C explain the operation of the binary counters having a trimming function. For example, four binary counters or frequency dividers 81 to 84 having a trimming function are used to optionally adjust a frequency up to $2^4$=16 times.

In FIG. 18A, the four frequency dividers (binary counters) 81 to 84 are set to be initialized to "0000." In this case, the original oscillation frequency f of the oscillator 7 is multiplied by 16 to provide a trimmed frequency f' of $2^4$=16f. When the four frequency dividers 81 to 84 are set to be initialized to "1000" as shown in FIG. 18B, the trimmed frequency f' will be 15f ($2^4$-1=15). If the four frequency dividers 81 to 84 are set to be initialized to "1010" as shown in FIG. 18C, the trimmed frequency f' will be 7f ($2^4$-$2^3$-1=7). In this way, the four binary counters 81 to 84 are initialized to "0000," "1000," or "1010" when the highest frequency divider 84 is set to 0 from 1, i.e., when the four binary counters are initialized from "1111." FIG. 19 is a circuit diagram showing an example of a binary counter having a trimming function, and FIG. 20 is a table explaining the operation of the binary counter of FIG. 19.

The binary counter 800 (any one of 81 to 8n) has transfer gates 801 to 804 consisting of p- and n-channel MOS transistors, NAND gates 805 to 808, and an inverter 809. The binary counter 800 involves clock signals CLKX and CLKZ, a set signal SETX, and a reset signal RESETX. The binary counter 800 provides an output signal SRTJZ. The signal CLKZ is a positive logic signal, and the signal CLKX is a negative logic signal, i.e., an inversion of the signal CLKZ. The signals SETX and RESETX are negative logic signals, and the output signal SRTJZ is a positive logic signal. The signal CLKZ (CLKX) corresponds to an output signal SRTJZ from a preceding counter, or an output signal f of an oscillator OSC. The negative logic signal CLKX is an inversion of an input signal to the inverter 809, or an inversion of the output signal SRTJZ, or an inverted output from the oscillator OSC.

Figures 19, 20:
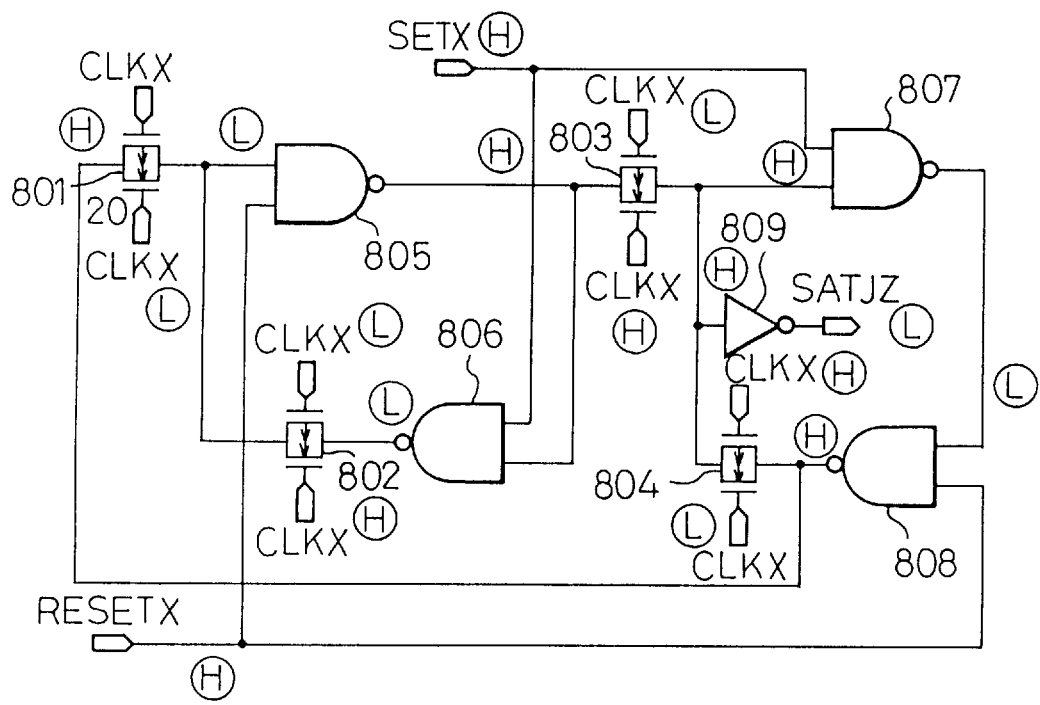
FIG. 19 is a circuit diagram showing a binary counter having a trimming function.
FIG. 20 is a diagram for explaining the operation of the binary counter of FIG. 19.

The binary counter having a trimming function of FIG. 19 provides logical values shown in FIG. 20 in response to the clock signals CLKX and CLKZ, set signal SET, and reset signal RESET.

In FIG. 20, the initial value of the binary counter of FIG. 19 is determined according to the signals SETX and RESETX. When the signals SETX and RESETX are each at low level, the initial value of the binary counter is indefinite, and no frequency division is carried out. Namely, the binary counter is disabled. The signals SETX and RESETX are set to high or low level to set an initial value, and indefinite level to count up, to thereby carry out a required operation.

Figure 21:
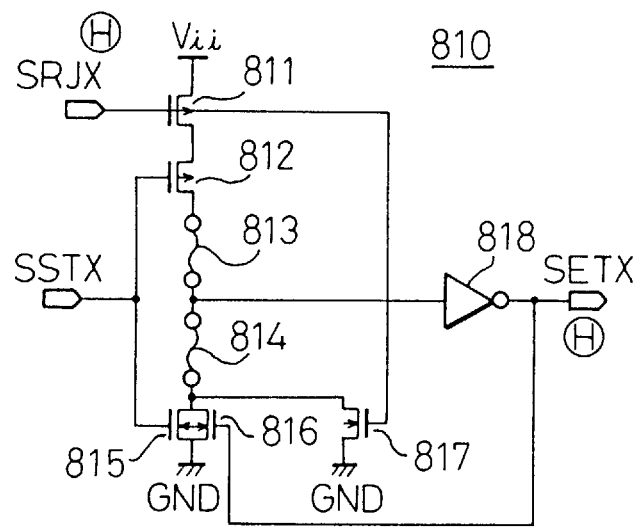
FIG. 21 is a diagram showing a circuit for generating a signal for the binary counter of FIG. 19.
Figure 22:
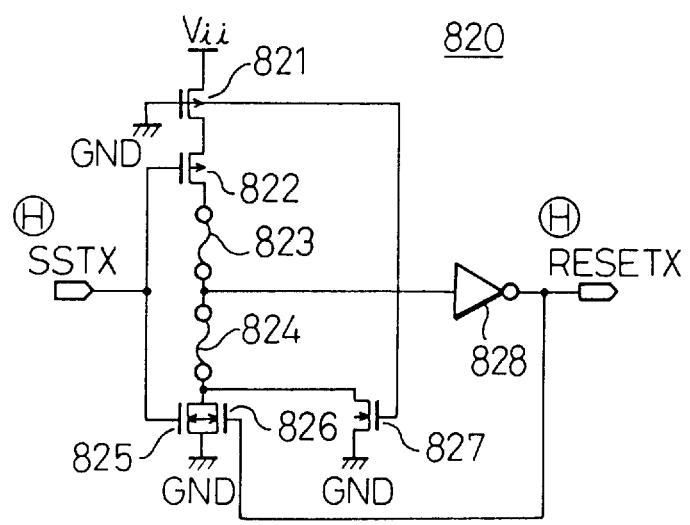
FIG. 22 is a diagram showing a circuit for generating a signal for the binary counter of FIG. 19.

FIGS. 21 and 22 show circuits for generating signals used by the binary counter of FIG. 19, in which FIG. 21 is a circuit for generating the set signal SETX, and FIG. 22 is a circuit for generating the reset signal RESETX.

In FIG. 21, the circuit 810 for generating the set signal SETX for the binary counter of FIG. 19 has p-channel MOS transistors 811 and 812, n-channel MOS transistors 815, 816, and 817, an inverter 818, and fuses 813 and 814. The gate of the transistor 811 receives a control signal SRJX, and the gates of the transistors 812 an 815 receive a control signal SSTX.

In FIG. 22, the circuit 820 for generating the reset signal RESETX for the binary counter of FIG. 19 has p-channel MOS transistors 821 and 822, n-channel MOS transistors 825, 826, and 827, an inverter 828, and fuses 823 and 824. The gate of the transistor 821 is connected to a low-potential power source GND, and the gates of the transistors 822 and 825 receive the control signal SSTX.

In FIGS. 21 and 22, the fuses 813, 814, 823, and 824 are selectively blown out to adjust the set signal SETX and reset signal RESETX.

Figure 23:
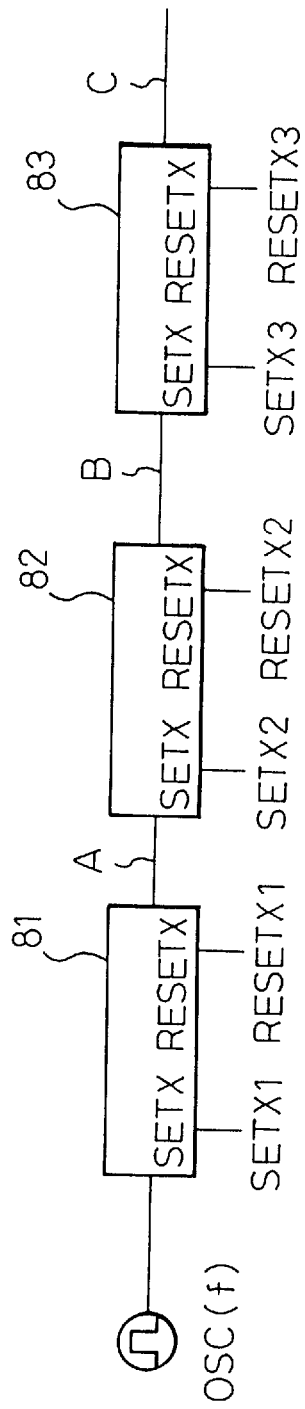
FIG. 23 is a diagram showing a refresh cycle trimming circuit having three binary counters.
Figure 24:
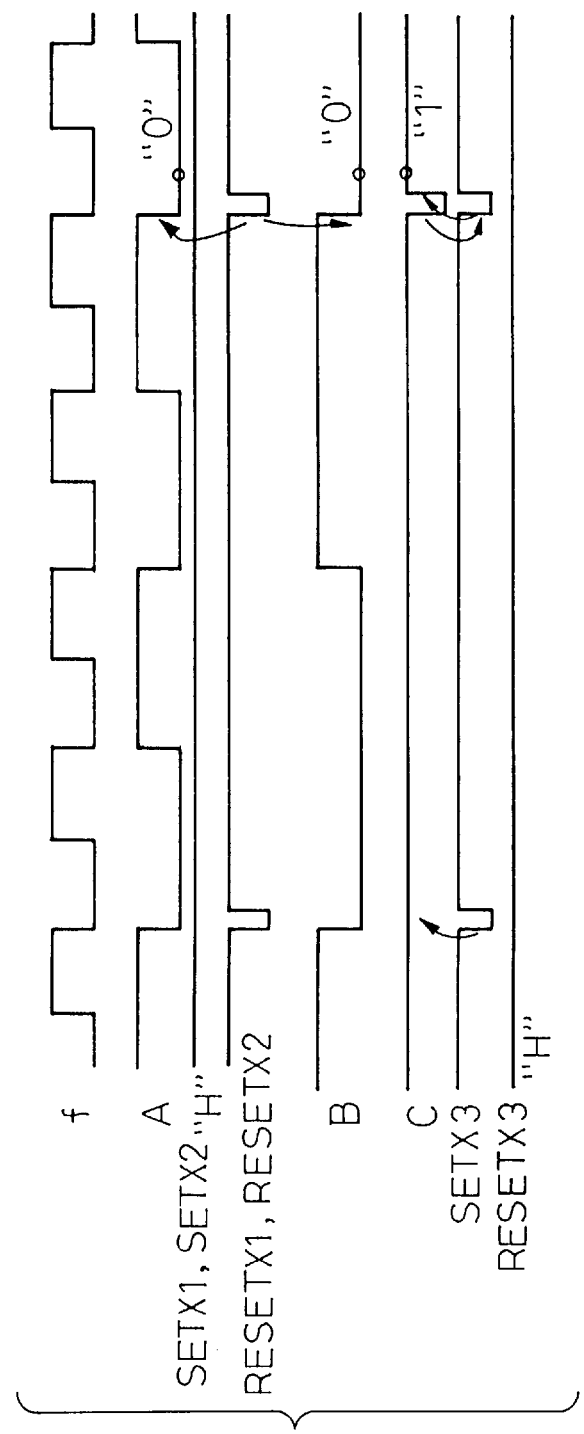
FIG. 24 is a diagram for explaining the operation of the trimming circuit of FIG. 23.

FIG. 23 shows a refresh cycle trimming circuit consisting of three binary counters, and FIG. 24 explains the operation of the trimming circuit of FIG. 23.

To quadruple the oscillation frequency "f" of an oscillator OSC and provide a signal having a frequency of 4f in FIG. 23, the binary counters 81, 82, and 83 are set to be initialized to "001" in their outputs A, B, and C. Namely, when the binary counters 81 to 83 become "111," they are initialized to "001" to provide a signal having a frequency of 4f, i.e., four times the oscillation frequency f, from the output C of the counter 83, as shown in FIG. 24.

Figure 25:
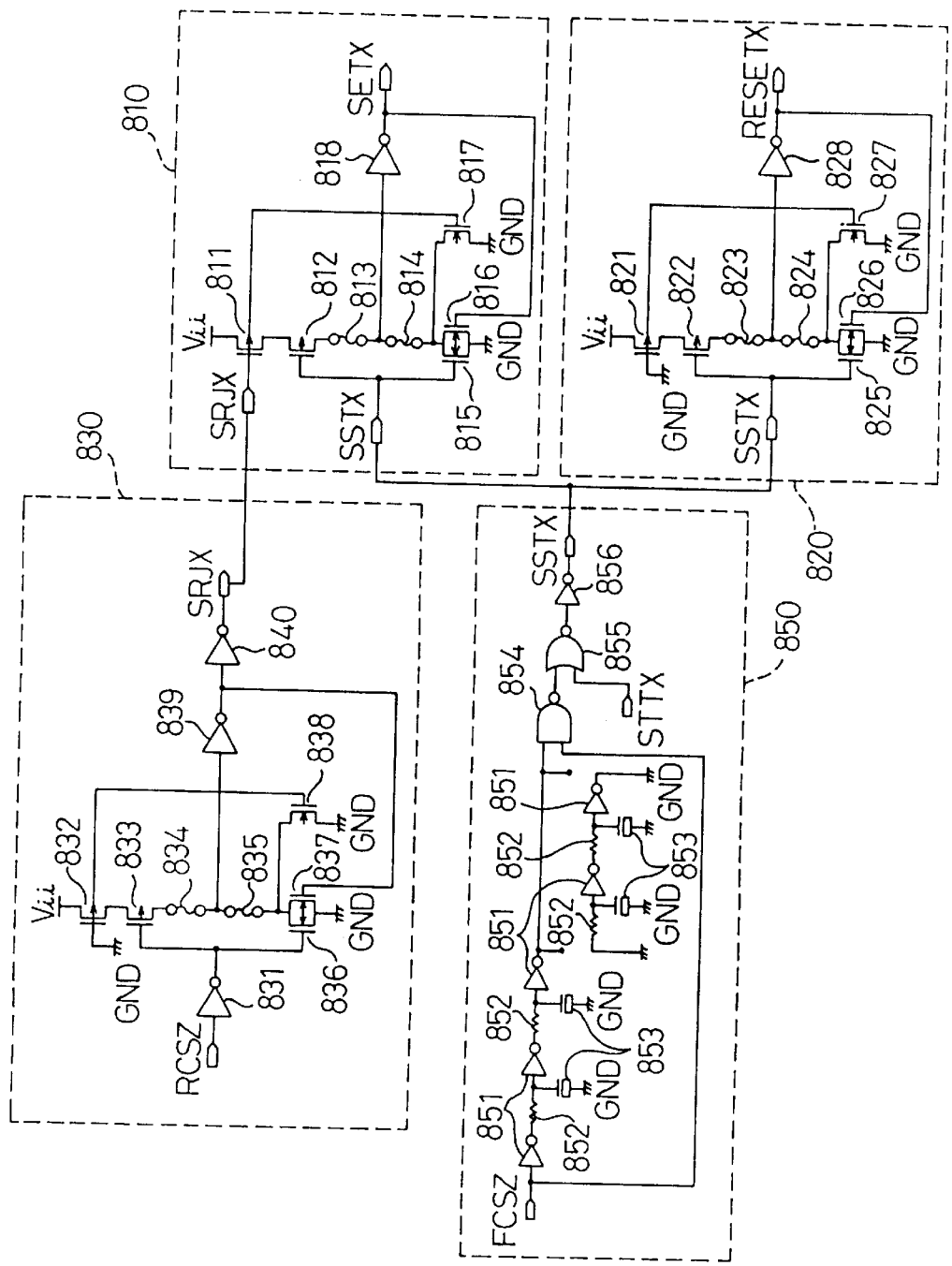
FIG. 25 is a diagram showing a refresh cycle trimming circuit without a trimming operation.
Figure 26:
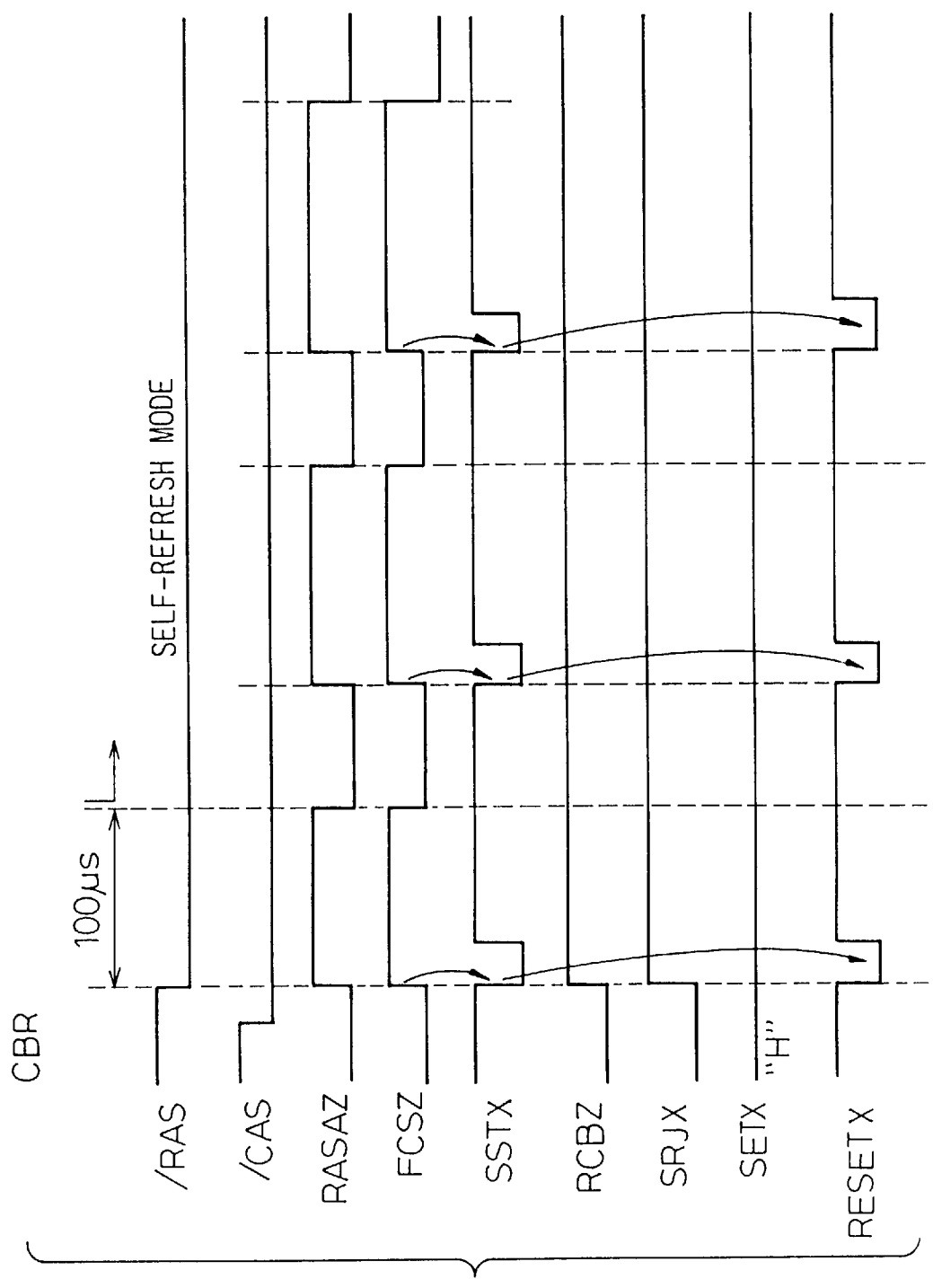
FIG. 26 is a diagram for explaining the operation of the circuit of FIG. 25.

FIG. 25 shows a refresh cycle trimming circuit without carrying out a trimming process, and FIG. 26 explains the operation of the circuit of FIG. 25.

In FIG. 25, a circuit 830 is singularly arranged in a semiconductor memory chip, to generate the signal SRJX for the set signal generator 810 of FIG. 21 in response to a signal RCBZ from a circuit RASGEN for generating a row address strobe signal /RAS. A circuit 850 is also singularly arranged in the chip, to generate the signal SSTX for the set signal generator 810 and reset signal generator 820 of FIGS. 21 and 22 in response to a signal FCSZ from a CBR buffer CBRBUF1. The set signal generator 810 and reset signal generator 820 are arranged for each frequency divider (counter).

In FIG. 25, the SRJX signal generator 830 has inverters 831, 839, and 840, p-channel MOS transistors 832 and 833, n-channel MOS transistors 836, 837, and 838, and fuses 834 and 835. The SSTX signal generator 850 has inverters 851, resistors 852, capacitors 853, a NAND gate 854, a NOR gate 855, and an inverter 856.

When no trimming is carried out under a default state, all of the fuses 834, 835, 813, 814, 823, and 824 are left as they are in the SRJX signal generator 830, set signal generator 810, and reset signal generator 820. When a self-refresh mode is started, the signal SRJX maintains high level, the set signal SETX always maintains high level, and the reset signal RESETX changes according to the signal SSTX, as shown in FIG. 26. According to the set signal SETX of high level and the reset signal RESETX that changes to low level in response to the signal SSTX, the initial value of the counter is set to 0. Namely, when the highest counter changes from 1 to 0, a self-refresh signal is provided. The self-refresh signal changes a signal RASAZ, which causes the signal SSTX provide a pulse to reset the counter.

Figure 27:
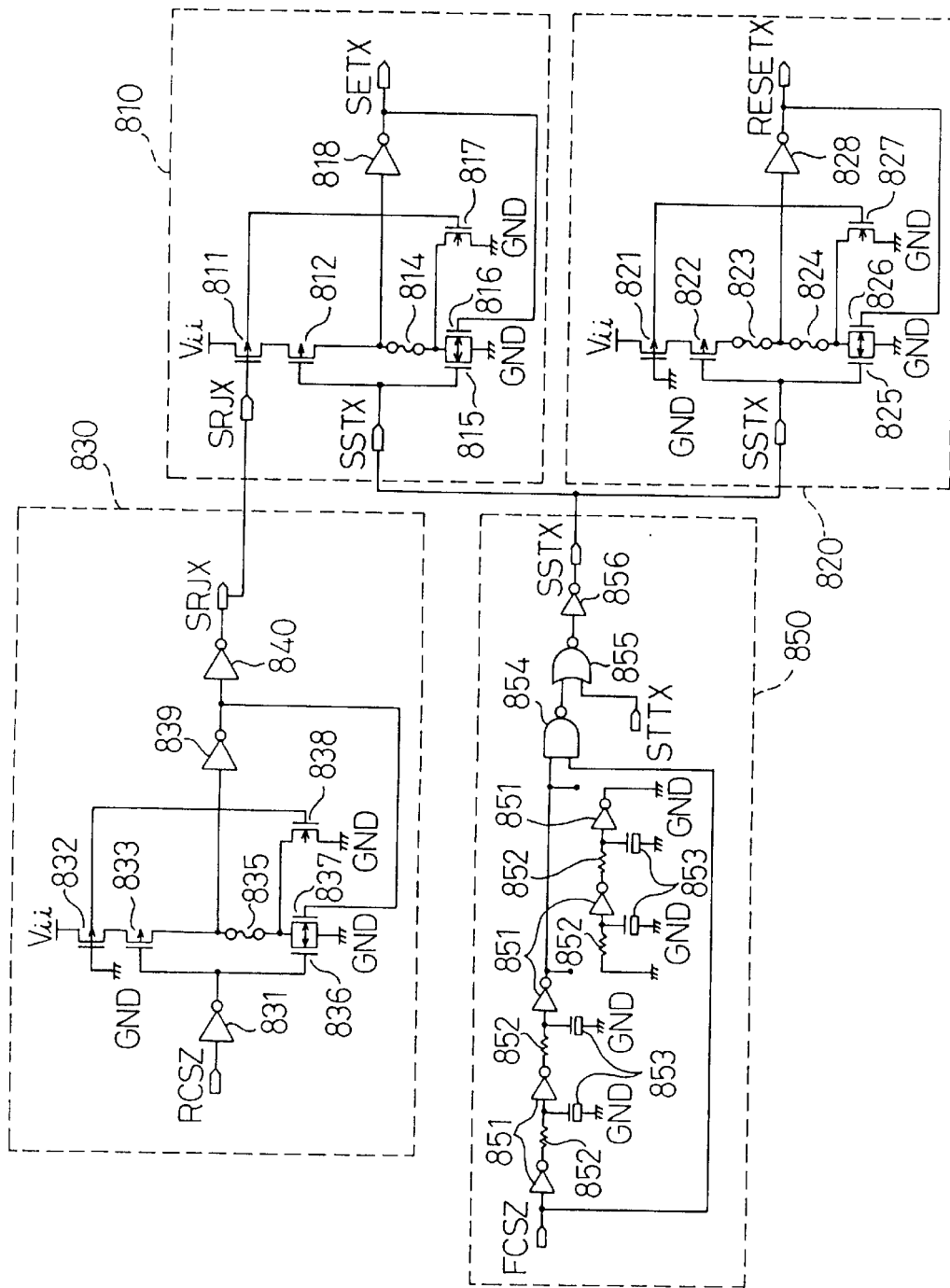
FIG. 27 is a diagram showing the refresh cycle trimming circuit with a trimming operation.
Figure 28:
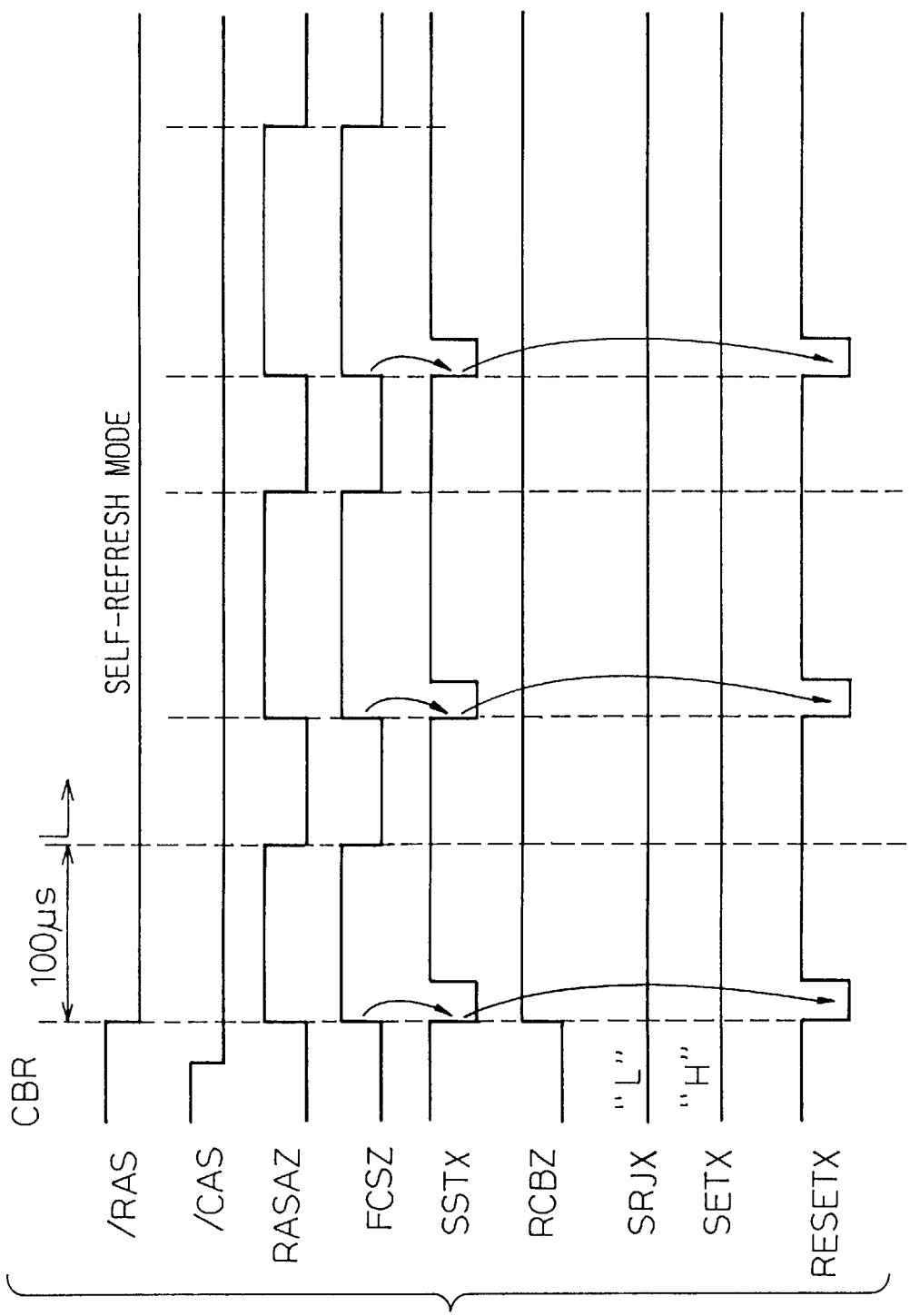
FIG. 28 is a diagram for explaining the operation of the circuit of FIG. 27.
Figure 29:
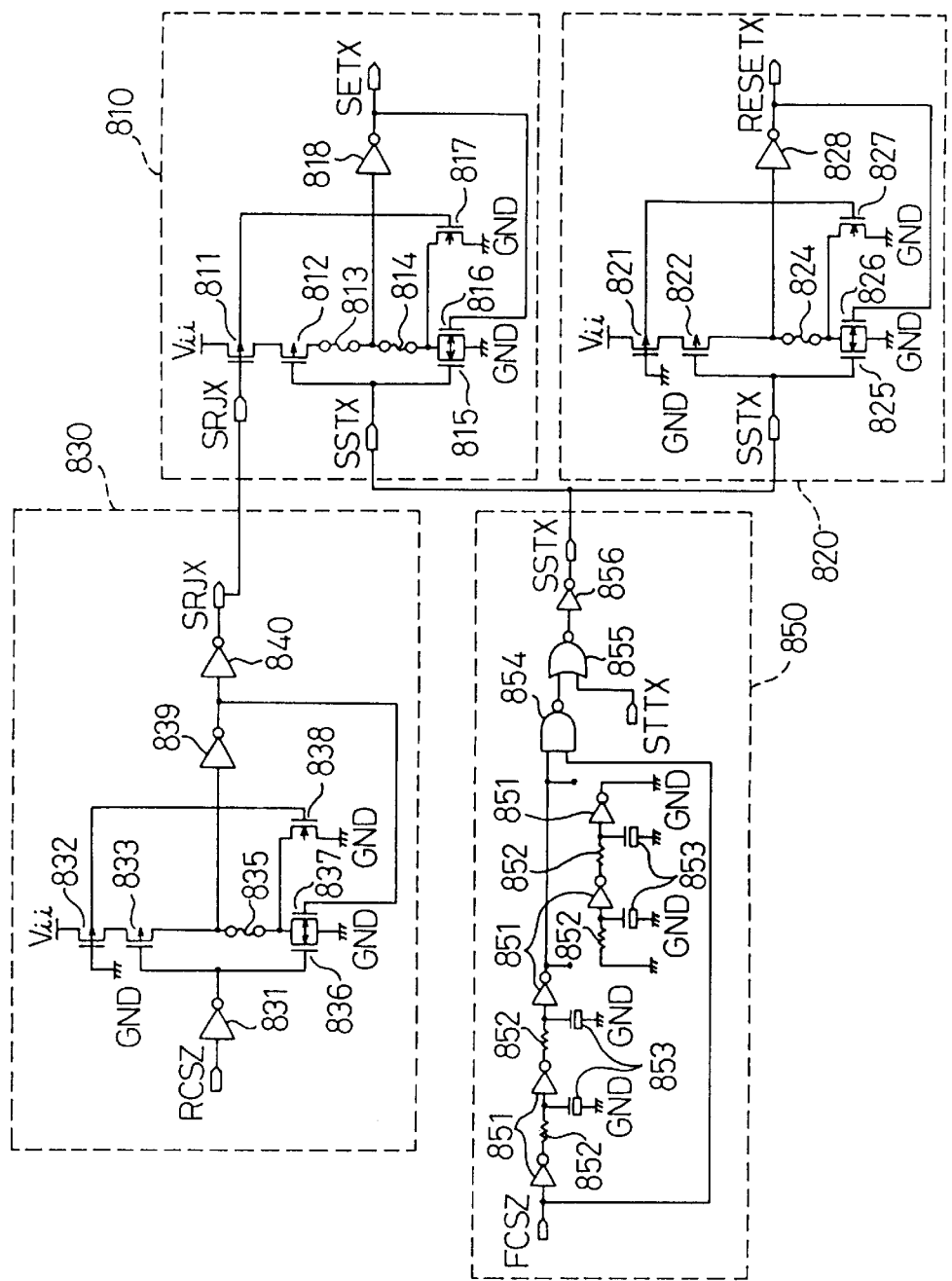
FIG. 29 is a diagram showing the refresh cycle trimming circuit with a trimming operation.

FIG. 27 shows the case of carrying out trimming by setting the initial value of the counter to 0, and FIG. 28 explains the operation of the circuit of FIG. 27. FIG. 29 shows the case of carrying out trimming by setting the initial value of the counter to 1, and FIG. 30 explains the operation of the circuit of FIG. 29.

To carry out trimming, the fuse 834 in the SRJX signal generator 830 is blown out as shown in FIGS. 27 and 29. The SRJX signal generator 830 has two fuses 834 and 835 in which the fuse 835 is a dummy, and therefore, the fuse 834 alone is actually blown out.

To set the initial value of the counter to 0, the fuse 813 in the set signal generator 810 is blown out as shown in FIG. 27. The set signal generator 810 has two fuses 813 and 814 in which the fuse 814 is a dummy, and therefore, only the fuse 813 is actually blown out. As a result, the signal SRJX is always at low level, the signal SETX is always maintained at high level, and the signal RESETX is changed according to the signal SSTX, as shown in FIG. 28. According to the signal SETX of high level and the signal RESETX that is changed to low level in response to the signal SSTX, the initial value of the counter is set to 0.

Figure 30:
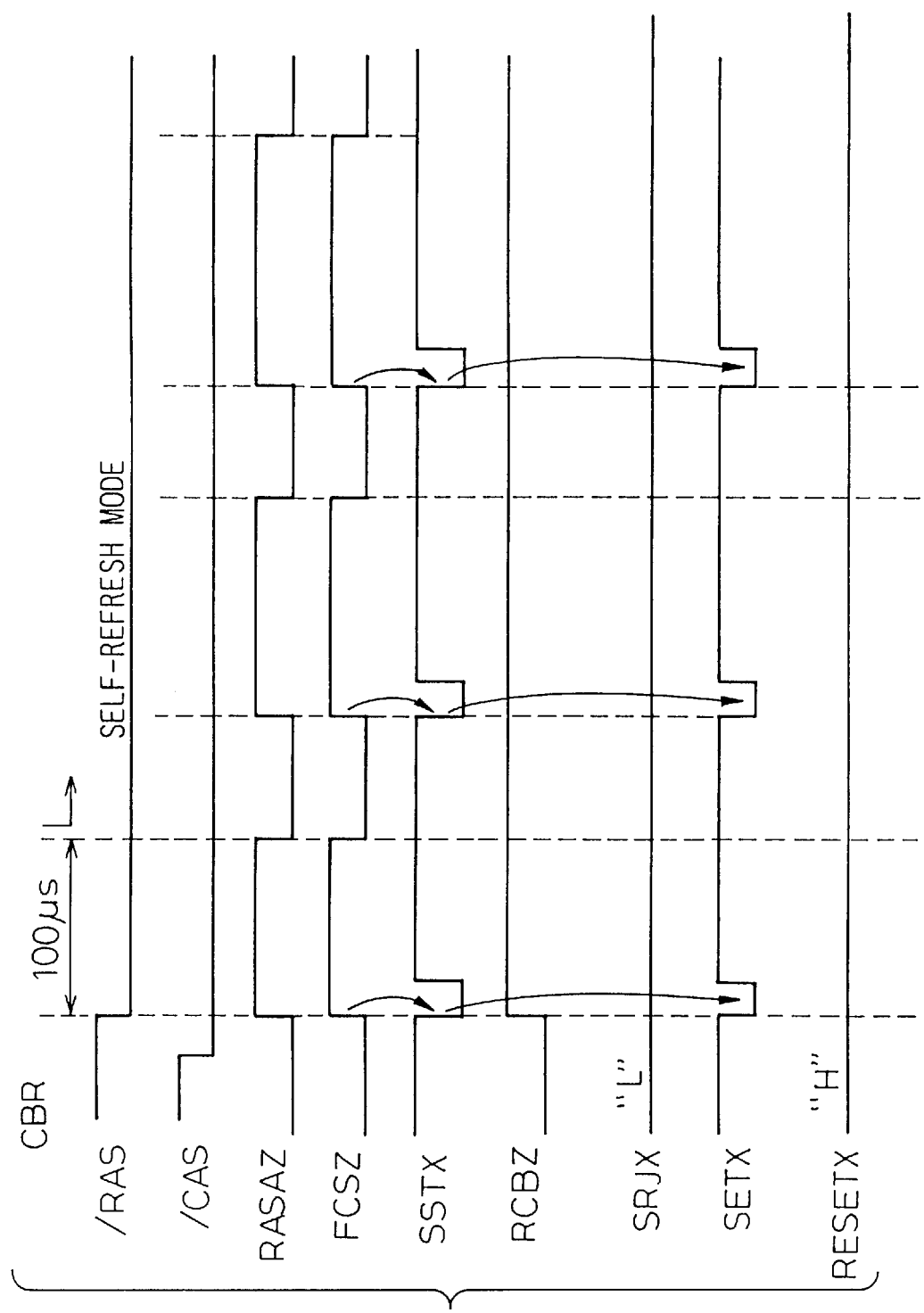
FIG. 30 is a diagram for explaining the operation of the circuit of FIG. 29.

To set the initial value of the counter to 1, the fuse 823 in the reset signal generator 820 is blown out as shown in FIG. 29. The reset signal generator 820 has two fuses 823 and 824 in which the fuse 824 is a dummy, and therefore, only the fuse 823 is actually blown out. As a result, the signal SRJX is always at low level, the signal SETX changes according to the signal SSTX, and the signal RESETX is always at high level, as shown in FIG. 30. According to the signal SETX that changes to low level according to the signal SSTX, and the signal RESETX of high level, the initial value of the counter is set to 1.

In this way, there is provided a signal whose frequency (f') is an optional multiple of the oscillation frequency (f) of an oscillator. The present invention optimizes the refresh period of a self-refreshing operation according to an actual data hold time of memory cells in consideration of changes in the characteristics of the memory cells due to a temperature change, to thereby maximize battery life.

Figure 33:
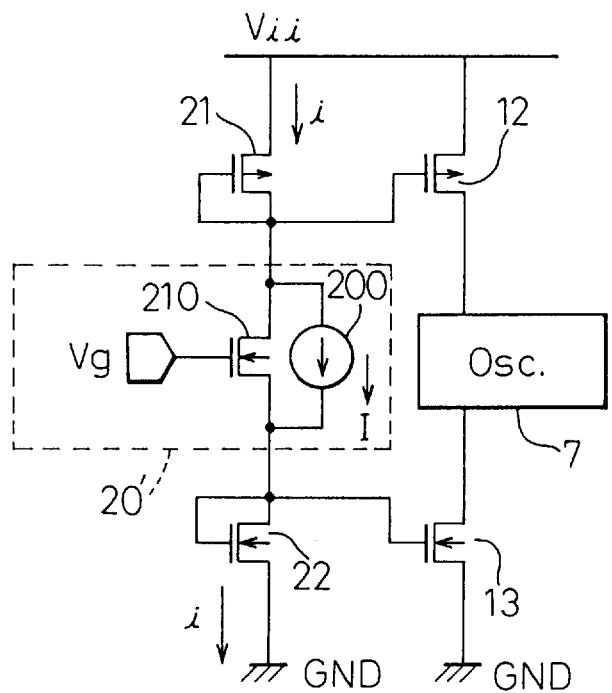
FIG. 33 is a circuit diagram showing an essential part of a semiconductor memory according to a modification of the present invention.

FIG. 33 explains a problem in a semiconductor memory according to the present invention.

As explained above, a semiconductor memory according to any one of the embodiments of the present invention adjusts the refresh period of a self-refreshing operation according to the temperature-dependent data hold time of memory cells, to reduce a standby current. These embodiments correct differences in the characteristics of memory cells due to manufacturing unevenness by trimming. It is preferable to minimize the number of trimming processes, to reduce testing costs. The embodiments mentioned above must adjust an oscillation frequency and the temperature coefficient of the oscillation frequency. Since the adjustment of oscillation frequency is carried out in conventional DRAMs, the testing costs will be reduced if the adjustment of the temperature coefficient of an oscillation frequency is omitted.

To omit the adjustment of the temperature coefficient of an oscillation frequency, it is necessary not to stop an oscillator, and to suppress the temperature coefficient of an oscillation frequency below the temperature coefficient of the data hold time of memory cells.

Accordingly, a semiconductor memory according to a modification of the present invention employs a current source (20, 20') that secures a minimum current.

FIG. 33 is a circuit diagram showing an essential part of a semiconductor memory according to the modification of the present invention. This circuit corresponds to the circuit of FIG. 9B. As is apparent from the comparison between FIGS. 33 and 9B, the current source 20' of FIG. 33 has a minimum current securing circuit 200 between the source and drain of a transistor 210. The current source 20' passes a current i, and the minimum current securing circuit 200 passes a current I.

The current source 20 of FIG. 9B controls the oscillation frequency of the oscillator (ring oscillator) 7 only by a current passing through the transistor 210. Since the transistor 210 operates in a subthreshold region, it is greatly affected by manufacturing unevenness, and if no trimming is carried out, the oscillator may stop to operate in the worst case.

On the other hand, the minimum current securing circuit 200 of the current source 20' of FIG. 33 secures the oscillating operation of the oscillator 7. Accordingly, even if there is large manufacturing unevenness, the oscillating operation of the oscillator 7 is secured without trimming. The minimum current securing circuit 200 serves as a limiter for suppressing the temperature coefficient of an oscillation frequency below the temperature coefficient of the data hold time of memory cells.

Figure 34:
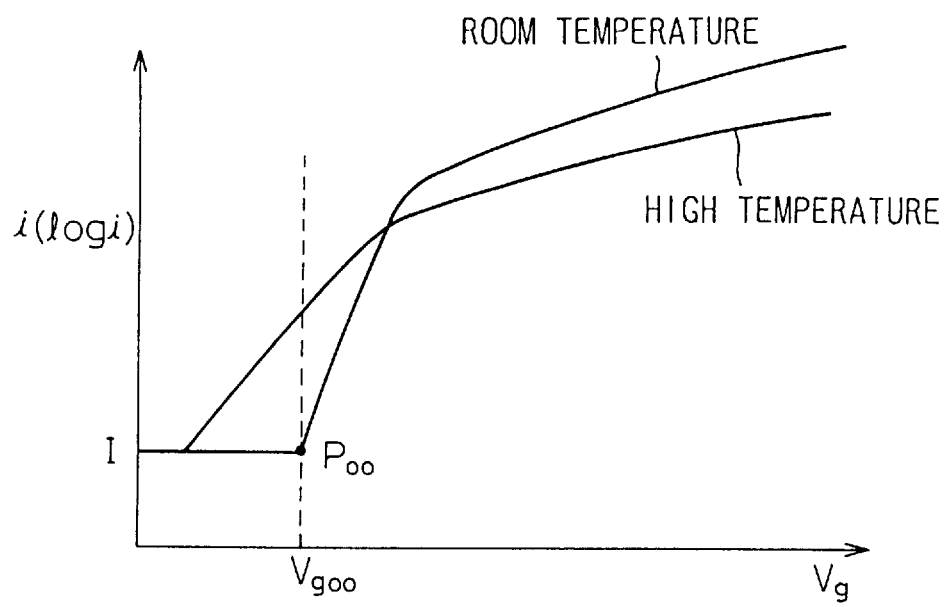
FIG. 34 is a diagram for explaining a principle of the modification of FIG. 33.

FIG. 34 explains the principle of the semiconductor memory according to the modification of the present invention. This figure shows a relationship between the current i passing through the current source 20' and the current I passing through the minimum current securing circuit 200. In FIG. 34, an ordinate represents the current i (log i) passing through the current source 20', and an abscissa represents a gate voltage Vg of the transistor 210. The oscillation frequency of the oscillator 7 is proportional to the current i passing through the current source 20'.

The oscillation frequency of the oscillator 7 is provided with a temperature coefficient according to a difference in the current i between high and low temperatures. If there is large manufacturing unevenness, the difference will be too large.

In this case, the preceding embodiments involve an increased number of tests to determine whether the oscillation frequency of the oscillator 7 must be adjusted at a high temperature or a low temperature. Accordingly, the modification of the present invention secures that the temperature coefficient of an oscillation frequency is below the temperature coefficient of the data hold time of memory cells, and adjusts the oscillation frequency only at a high temperature, thereby simplifying tests. Namely, the current I passing through the minimum current securing circuit 200 secures the minimum value of the current i passing through the current source 20'.

When the minimum current (I) passing through the current source 20' is secured as shown in FIG. 34, the ratio of a high temperature to a low temperature reaches a maximum when the gate voltage Vg (Vg00) passes a point P00. Accordingly, if a bias point shifts from the point P00, the ratio, i.e., the temperature coefficient of an oscillation frequency becomes smaller. Accordingly, if the bias at which the gate voltage Vg (Vg00) passes the point P00 is equalized with the temperature coefficient of the data hold time of memory cells, the temperature coefficient of an oscillation frequency will never exceed the temperature coefficient of the data hold time of memory cells. As a result, the current source 20' with the minimum current securing circuit 200 serves as a limiter to suppress the temperature coefficient of an oscillation frequency below the temperature coefficient of the data hold time of memory cells.

Figure 35:
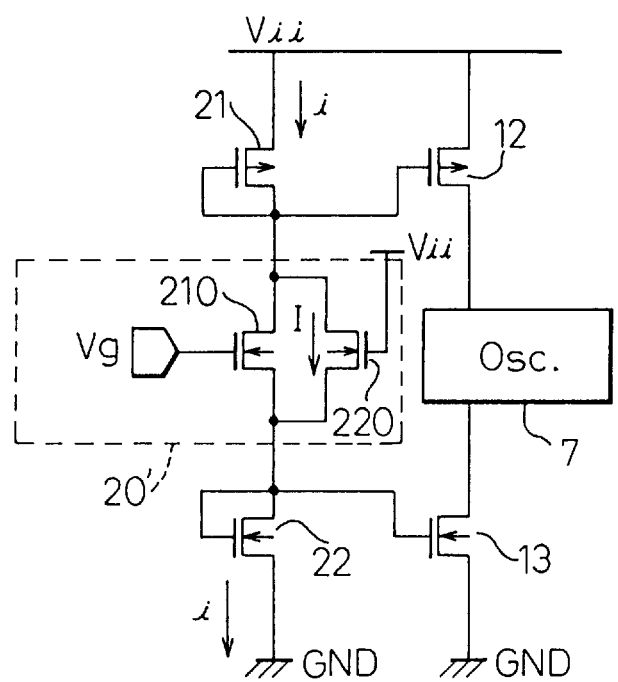
FIG. 35 is a circuit diagram showing a minimum current securing circuit of the semiconductor memory of FIG. 34.
Figure 36:
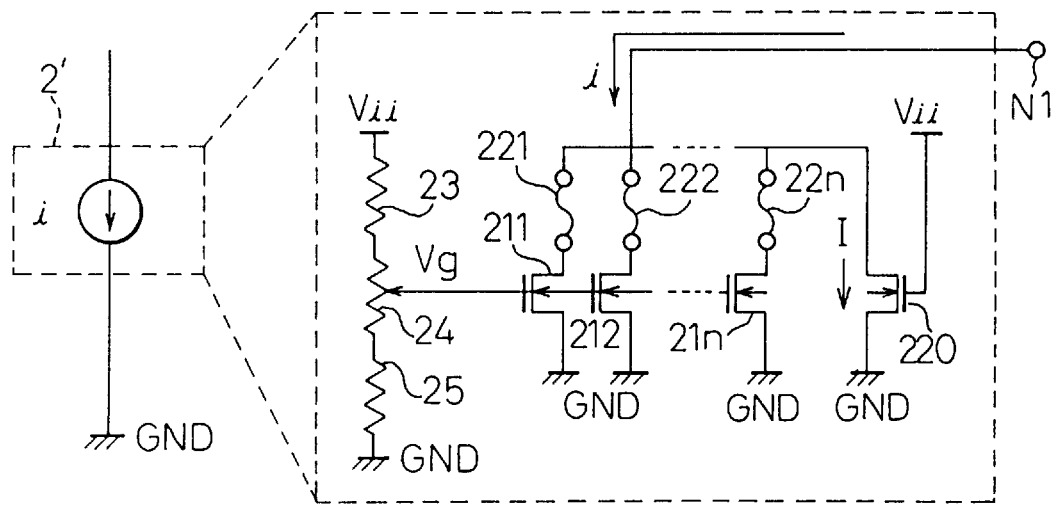
FIG. 36 is a circuit diagram showing a semiconductor memory employing the arrangement of FIG. 35.

FIG. 35 is a circuit diagram showing an example of the minimum current securing circuit of FIG. 33. FIG. 36 is a circuit diagram showing a semiconductor memory employing the arrangement of FIG. 35. In FIG. 35, the minimum current securing circuit 200 of FIG. 33 is formed of an n-channel MOS transistor 220. In FIG. 36, the circuit of FIG. 5 is additionally provided with the transistor 220 of FIG. 35 serving as a minimum current securing circuit.

In FIG. 35, the n-channel MOS transistor 220 has a gate to which a high-potential power source voltage (Vii) is applied. The transistor 220 secures the minimum value (minimum current I) of the current i passing through the current source 20'. The transistor 220 does not operate in a subthreshold region, so that it is less affected by manufacturing unevenness compared with the transistor 210 that operates in a subthreshold region. Even if there is large manufacturing unevenness, the oscillating operation of the oscillator 7 is secured without trimming, to maintain a refresh operation of the semiconductor memory (DRAM).

In FIG. 36, the current source 2' consists of current source transistors 211 to 21n, fuses 221 to 22n, resistors 23 and 25, and a variable resistor 24. In this case, the minimum current securing circuit 200 of the current source 2' is the n-channel MOS transistor 220 whose gate is connected to a high-potential power source voltage (Vii). The transistor 220 is in parallel with the transistors 211 to 21n and fuses 221 to 22n. The transistor 220 serving as the minimum current securing circuit 200 secures the minimum value (minimum current I) of a current i passing through the current source 2', to secure the oscillating operation of the oscillator 7 and maintain a refresh operation of the DRAM without trimming. Similar to the circuit of FIG. 35, the transistor 220 is less affected by manufacturing unevenness compared with the transistors 211 to 21n that operate in subthreshold regions.

The minimum current securing circuit 200 of this modification is applicable not only to the embodiments of FIGS. 35 and 36 but also to other structures.

Figure 37:
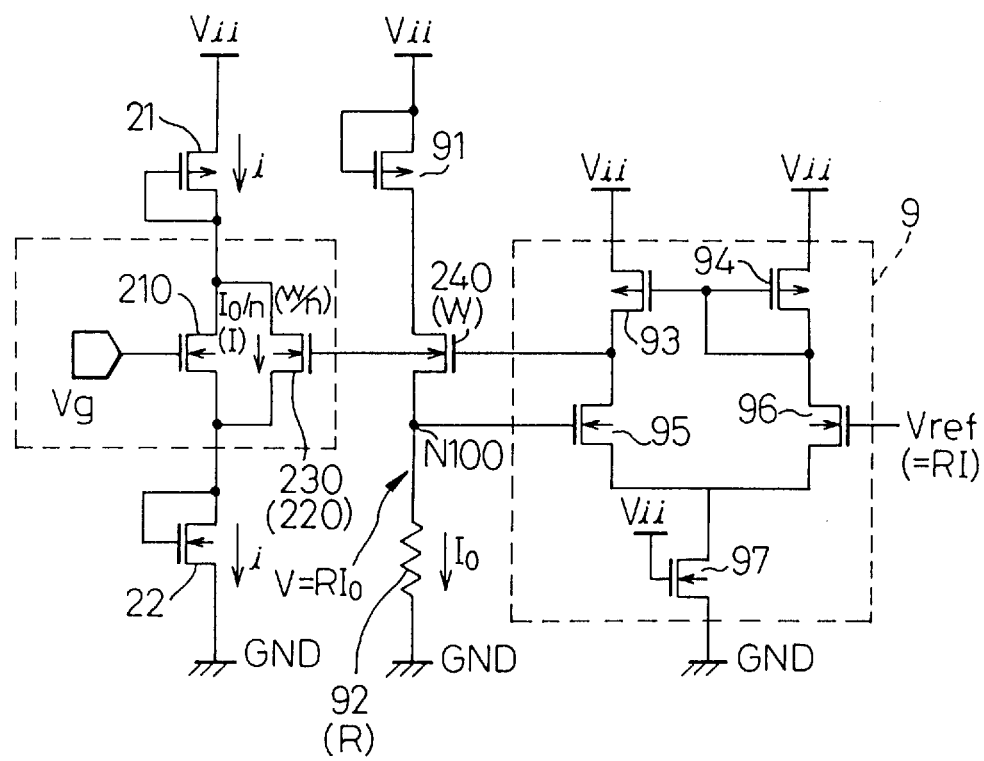
FIG. 37 is a circuit diagram showing a semiconductor memory according to a modification of the present invention.

FIG. 37 is a circuit diagram showing a semiconductor memory according to the modification of the present invention. A current passing through a transistor 230 (220) of this embodiment is less affected by manufacturing unevenness. This circuit includes a bias servo controller 9.

The bias servo controller 9 consists of p-channel MOS transistors 93 and 94 and n-channel transistors 95 to 97, to control a transistor 240 so that the voltage of a node N100 is equalized with a reference voltage Vref. If the voltage of the node N100 is always equal to the reference voltage Vref, a current Io flowing to a resistor 92 (R) is equal to Vref/R, which is always constant. The transistors 240 and 230 have a mirror relationship and a size ratio of n:1, i.e., the ratio of width of the transistors is n:1. Accordingly, the transistor 230 passes a minimum current I of Io/n.

Since the transistors 240 and 230 have a mirror relationship, manufacturing unevenness in the transistor 230 is cancelled, and therefore, a fluctuation in the current Io (minimum current I) is dependent only on fluctuations in the resistor 92 (R) and reference voltage Vref. Since the fluctuations in the resistor 92 and reference voltage Vref are small, the fluctuation in the current Io (minimum current I) is also small. To avoid an increase in a standby current, it is necessary to reduce the current consumption of the bias serve controller 9.

As explained above in detail, a semiconductor memory according to the present invention is capable of optionally adjusting the frequency of an output signal, to correct manufacturing unevenness and improve yield. This semiconductor memory is capable of freely setting the timing of distributed self-refreshing, to thereby extend battery life.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor memory for controlling a timing of refreshing a plurality of memory cells, comprising:
    a capacitor for holding charge;
    a comparison circuit for comparing the voltage of an end of said capacitor with a reference voltage;
    a precharge circuit having at least one transistor for precharging said capacitor, the transistor of said precharge circuit having a first electrode connected to a first power source line, a second electrode connected to the end of said capacitor and an end of a current source, and a control electrode to receive a timing control signal for controlling the switching of said precharge circuit, and wherein the other ends of said capacitor and said current source are connected to a second power source line; and
    said current source for discharging said capacitor, said current source having a positive temperature coefficient to increase a current to flow as temperature rises, wherein the timing of refreshing said memory cells is controlled based on a temporal change, in a voltage of said capacitor.

2. A semiconductor memory as claimed in claim 1, wherein said semiconductor memory is a dynamic random access memory having a self-refresh function and controlling a timing of self-refreshing said memory cells according to a temporal change in a voltage of said capacitor.

3. A semiconductor memory as claimed in claim 1, wherein said current source includes a current source transistor operated in a subthreshold region.

4. A semiconductor memory as claimed in claim 3, wherein said current source further includes a minimum current securing circuit connected in parallel with said current source transistor.

5. A semiconductor memory as claimed in claim 4, wherein said minimum current securing circuit includes a minimum current securing transistor having a control electrode connected to said first power source line.

6. A semiconductor memory as claimed in claim 3, wherein said current source includes a control voltage adjustment circuit for adjusting a control voltage supplied to the control electrode of said current source transistor, to control the temperature coefficient of said current source.

7. A semiconductor memory as claimed in claim 6, wherein said control voltage adjustment circuit includes a first resistor connected to said first power source line, a second resistor connected to said second power source line, and a variable resistor arranged between said first resistor and said second resistor, to provide the control voltage.

8. A semiconductor memory as claimed in claim 6, wherein said current source includes current source transistors used in a subthreshold region and fuse circuit for selectively connecting said current source transistors, to adjust a current passing through said current source.

9. A semiconductor memory as claimed in claim 8, wherein said current source further includes a minimum current securing circuit connected in parallel with said current source transistors and said fuse circuit.

10. A semiconductor memory as claimed in claim 9, wherein said minimum current securing circuit includes a minimum current securing transistor having a control electrode connected to said first power source line.

11. A semiconductor memory as claimed in claim 8, wherein said current source transistors have the same size.

12. A semiconductor memory as claimed in claim 8, wherein said current source transistors have different sizes.

13. A semiconductor memory as claimed in claim 1, wherein said current source includes a control voltage adjustment circuit for adjusting a control voltage supplied to control electrodes of current source transistors, to control the temperature coefficient of said current source.

14. A semiconductor memory as claimed in claim 13, wherein said control voltage adjustment circuit includes a first resistor connected to said first power source line, a second resistor connected to said second power source line, and a variable resistor arranged between said first resistor and said second resistor, to provide the control voltage.

15. A semiconductor memory as claimed in claim 1, wherein a capacitance of the capacitor is adjustable.

16. A semiconductor memory as claimed in claim 15, wherein said capacitor includes a plurality of capacitors and a plurality of fuse circuit for selectively connecting said capacitors, to adjust the capacitance of said capacitor.

17. A semiconductor memory as claimed in claim 16, wherein said capacitors have the same capacitance.

18. A semiconductor memory as claimed in claim 16, wherein said capacitors have different capacitances.

19. A semiconductor memory controlling a timing of refreshing a plurality of memory cells, comprising:
    an oscillation circuit having an oscillation frequency that varies according to a current passing through said oscillation circuit; and
    a current control circuit having a positive temperature coefficient to increase a current as the temperature rises, said current control circuit controlling the current passing through said oscillation circuit, for controlling the timing of refreshing said memory cells, wherein:
    said current control circuit includes a current source having the positive temperature coefficient to increase the current as the temperature rises, a first transistor disposed between a current source circuit and a first power source line, a second transistor disposed between said current source circuit and a second power source line, and an oscillation frequency control circuit controlled by said first and second transistors and providing said oscillation circuit with a predetermined current, to control an oscillation frequency of said oscillation circuit; and said oscillation circuit is a ring oscillator having an odd number of series-connected inverters, said inverters being connected to said first power source line through first control transistors, respectively, said first control transistors being current-mirror-connected to said first transistor, said inverters being connected to said second power source line through second control transistors, respectively, said second control transistors being current-mirror-connected to said second transistor.

20. A semiconductor memory as claimed in claim 19, wherein the output of each of said inverters in said oscillation circuit is connected to a capacitor.

21. A semiconductor memory as claimed in claim 19, wherein said current source includes a current source transistor operated in a subthreshold region.

22. A semiconductor memory as claimed in claim 21, wherein said current source further includes a minimum current securing circuit connected in parallel with said current source transistor.

23. A semiconductor memory as claimed in claim 22, wherein said minimum current securing circuit includes a minimum current securing transistor having a control electrode connected to said first power source line.

24. A semiconductor memory as claimed in claim 21, wherein said current source includes a control voltage adjustment circuit for adjusting a control voltage supplied to the control electrode of said current source transistor, to control the temperature coefficient of said current source.

25. A semiconductor memory as claimed in claim 24, wherein said control voltage adjustment circuit includes a first resistor connected to said first power source line, a second resistor connected to said second power source line, and a variable resistor arranged between said first resistor and said second resistor, to provide the control voltage.

26. A semiconductor memory as claimed in claim 19, wherein said current source includes current source transistors used in a subthreshold region and fuse circuit for selectively connecting said current source transistors, to adjust a current value passing through said current source.

27. A semiconductor memory as claimed in claim 26, wherein said current source further includes a minimum current securing circuit connected in parallel with said current source transistors and said fuse circuit.

28. A semiconductor memory as claimed in claim 27, wherein said minimum current securing circuit includes a minimum current securing transistor having a control electrode connected to said first power source line.

29. A semiconductor memory as claimed in claim 26, wherein said current source transistors have the same size.

30. A semiconductor memory as claimed in claim 26, wherein said current source transistors have different sizes.

31. A semiconductor memory as claimed in claim 26, wherein said current source includes a control voltage adjustment circuit for adjusting a control voltage supplied to the control electrodes of said current source transistors, to control the temperature coefficient of said current source.

32. A semiconductor memory as claimed in claim 31, wherein said control voltage adjustment circuit includes a first resistor connected to said first power source line, a second resistor connected to said second power source line, and a variable resistor arranged between said first resistor and second resistor, to provide the control voltage.

33. A semiconductor memory as claimed in claim 19, wherein said semiconductor memory further comprises counters having a trimming function and providing a signal whose frequency is an optional multiple of the oscillation frequency of the output of said oscillation circuit.

34. A semiconductor memory as claimed in claim 33, wherein said counters are binary counters having a trimming function, initial values to be set in said binary counters being controlled to provide the frequency that is the optional multiple of the oscillation frequency.

* * * * *